US012499835B2

(12) United States Patent
Youn et al.

(10) Patent No.: US 12,499,835 B2
(45) Date of Patent: Dec. 16, 2025

(54) GLOBAL SENSING CURRENT GENERATING CIRCUIT AND DISPLAY DEVICE INCLUDING THE SAME

(71) Applicant: LG DISPLAY CO., LTD., Seoul (KR)

(72) Inventors: Jae Woong Youn, Paju-si (KR); In June Kim, Paju-si (KR); Hye Bin Yang, Paju-si (KR)

(73) Assignee: LG Display Co., Ltd, Seoul (KR)

( * ) Notice: Subject to any disclaimer, the term of this patent is extended or adjusted under 35 U.S.C. 154(b) by 0 days.

(21) Appl. No.: 18/816,872

(22) Filed: Aug. 27, 2024

(65) Prior Publication Data

US 2025/0218358 A1 Jul. 3, 2025

(30) Foreign Application Priority Data

Dec. 29, 2023 (KR) ........................ 10-2023-0197608

(51) Int. Cl.

| | |
|---|---|
| ***G09G 3/3233*** | (2016.01) |
| ***G09G 3/00*** | (2006.01) |
| ***G09G 3/20*** | (2006.01) |
| ***H10K 59/131*** | (2023.01) |
| ***H10K 59/88*** | (2023.01) |

(52) U.S. Cl.

CPC ........... *G09G 3/3233* (2013.01); *G09G 3/006* (2013.01); *G09G 3/2096* (2013.01); *H10K 59/131* (2023.02); *H10K 59/88* (2023.02); *G09G 2300/0413* (2013.01); *G09G 2300/0819* (2013.01); *G09G 2300/0842* (2013.01); *G09G 2300/0861* (2013.01); *G09G 2310/08* (2013.01); *G09G 2320/0257* (2013.01); *G09G 2320/045* (2013.01); *G09G 2320/0626* (2013.01); *G09G 2330/08* (2013.01); *G09G 2330/10* (2013.01); *G09G 2330/12* (2013.01)

(58) Field of Classification Search

CPC .... G09G 3/3233; G09G 3/006; G09G 3/2096; G09G 3/3291; H10K 59/131; H10K 59/88

See application file for complete search history.

(56) References Cited

U.S. PATENT DOCUMENTS

| | | | | |
|---|---|---|---|---|
| 11,398,182 B2 * | 7/2022 | Park | ..................... | G09G 3/3233 |
| 11,763,745 B2 * | 9/2023 | Lim | ..................... | G09G 3/2007<br>345/691 |

(Continued)

FOREIGN PATENT DOCUMENTS

| | | |
|---|---|---|
| JP | 2012-073498 A | 4/2012 |
| KR | 10-2019-0020261 A | 2/2019 |

(Continued)

OTHER PUBLICATIONS

Office Action in Taiwanese Appln. No. TW113133868, mailed on May 28, 2025, 16 pages (with English translation).

(Continued)

*Primary Examiner* — Sardis F Azongha
(74) *Attorney, Agent, or Firm* — Fish & Richardson P.C.

(57) ABSTRACT

A global sensing current generating circuit and a display device including the same, and more particularly to a global sensing current generating circuit that senses a global current in a display area, and a display device that compensates for a fluctuation in the global current based on a current value of the sensed global current.

23 Claims, 24 Drawing Sheets

(56) References Cited

U.S. PATENT DOCUMENTS

| | | | | |
|---|---|---|---|---|
| 12,073,767 | B2 * | 8/2024 | Jeon | G09G 3/2096 |
| 2023/0066436 | A1 | 3/2023 | Rutkowski | |

FOREIGN PATENT DOCUMENTS

| | | | |
|---|---|---|---|
| KR | 10-2019-0029831 | A | 3/2019 |
| KR | 10-2022-0015620 | A | 2/2022 |
| TW | 201704959 | A | 2/2017 |
| TW | 201706807 | A | 2/2017 |

OTHER PUBLICATIONS

Office Action in Korean Appln. No. 10-2023-0197608, mailed on Jul. 14, 2025, 15 pages (with English translation).

* cited by examiner

FIG. 13

| Global Current Reduction Ratio [%] | Compensation Gain [Magnification] | Global Current After Compensation [%] |
|---|---|---|
| 0 | 1.00 | 100 |
| 5 | 1.05 | 100 |
| 10 | 1.11 | 100 |
| 15 | 1.18 | 100 |
| 20 | 1.25 | 100 |
| 25 | 1.33 | 100 |
| 30 | 1.43 | 100 |
| 35 | 1.54 | 100 |
| 40 | 1.67 | 100 |
| 45 | 1.82 | 100 |
| 50 | 2.00 | 100 |
| 55 | 2.22 | 100 |
| 60 | 2.50 | 100 |
| 65 | 2.86 | 100 |
| 70 | 3.33 | 100 |

GLOBAL SENSING CURRENT GENERATING CIRCUIT AND DISPLAY DEVICE INCLUDING THE SAME

CROSS-REFERENCE TO RELATED APPLICATION

This application claims the priority of Korean Patent Application No. 10-2023-0197608, filed Dec. 29, 2023, which is hereby incorporated by reference in its entirety.

BACKGROUND

Field of the Disclosure

The present disclosure relates to a global sensing current generating circuit and a display device including the same.

DESCRIPTION OF THE BACKGROUND

A driving circuit of a display device includes a data driving circuit that supplies a data voltage to data lines, a gate driving circuit that supplies a scan signal (or a gate signal) to gate lines (or scan lines), and the like. The gate driving circuit may be formed directly on the same substrate together with circuit elements of a pixel array constituting a screen.

The circuit elements of the pixel array constitute a pixel circuit formed in each of pixels defined in a matrix form by the data lines and gate lines of the pixel array.

Here, each of the circuit elements of the pixel array includes a plurality of transistors. In other words, one pixel circuit includes a plurality of transistors.

In general, as the driving time of the display device accumulates, electrical characteristics such as the threshold voltage of the transistor change.

When the electrical characteristics of the transistors change, a global current, which is a total current flowing through the pixel array, fluctuates, which may reduce the luminance of the display device.

SUMMARY

The present disclosure is to provide a global sensing current generating circuit that senses a global current of a display area, and a display device that compensates for a fluctuation in the global current based on a current value of the sensed global current.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

To achieve these and other advantages and in accordance with the present disclosure, as embodied and broadly described, a global sensing current generating circuit includes a plurality of sensing current generating circuits; and a single current sensing line connected to the plurality of sensing current generating circuits, and through which sensing currents generated by the plurality of sensing current generating circuits flow during a current sensing period, wherein each of the sensing current generating circuits includes: a driving transistor configured to generate the sensing current based on its gate-source voltage; a capacitor configured to charge the gate-source voltage of the driving transistor; and a plurality of switch transistors electrically connected to the driving transistor and the capacitor and configured to sample a threshold voltage of the driving transistor.

The global sensing current generating circuit may further include: a current summing circuit configured to receive the sensing currents generated by the plurality of sensing current generating circuits through the single current sensing line and to output a global current sensing value obtained by summing current values of the sensing currents during the current sensing period.

The global sensing current generating circuit may further include: a switch circuit configured to electrically connect the single current sensing line to the current summing circuit during the current sensing period, and to electrically connect and the single current sensing line to a low voltage power line commonly connected to a plurality of pixel circuits during a period other than the current sensing period.

The global sensing current generating circuit may further include: a current sensing data line connected to the plurality of sensing current generating circuits and configured to supply a current sensing data voltage to the plurality of sensing current generating circuits during the current sensing period.

The driving transistor is the same type of transistor as a driving transistor included in a pixel circuit, and the plurality of switch transistors are the same type of transistors as a plurality of switch transistors included in the pixel circuit.

The plurality of switch transistors and the plurality of switch transistors included in the pixel circuit are oxide transistors.

When the pixel circuit is driven while the low voltage power line and the single current sensing line are electrically connected by the switch circuit, at least one of positive bias stress and negative bias stress is accumulated in the plurality of switch transistors and the plurality of switch transistors included in the pixel circuit.

The sensing current generating circuit does not include a light emitting element.

The sensing current generating circuit may also be used as a repair pixel circuit for repairing a defective pixel circuit included in a display area.

The global sensing current generating circuit further include: a current sensing data line connected to the plurality of sensing current generating circuits and configured to supply a current sensing data voltage to the plurality of sensing current generating circuits during the current sensing period. When an Nth (N being a natural number of 1 or more) sensing current generating circuit of the plurality of sensing current generating circuits is used as the repair pixel circuit, the current sensing data voltage is not supplied to the Nth sensing current generating circuit during the current sensing period.

The current summing circuit may include an analog-to-digital converter (ADC) circuit configured to sum the current values of the sensing currents, which are analog values, and to output a summed value as the global current sensing value, which is a digital value, during the current sensing period.

In another aspect of the present disclosure, a display device includes a global sensing current generating circuit including a plurality of sensing current generating circuits disposed adjacent to one side of a display area; a single current sensing line connected to the plurality of sensing current generating circuits, and through which sensing currents generated by the plurality of sensing current generating circuits flow during a current sensing period; and a current summing circuit configured to receive the sensing currents generated by the plurality of sensing current generating circuits through the single current sensing line and to output a global current sensing value obtained by summing current values of the sensing currents during the current sensing period; and a timing controller configured to receive the global current sensing value outputted from the current summing circuit, check a global current fluctuation amount in the display area using the global current sensing value, and compensate for the global current fluctuation amount.

The timing controller may compensate for the global current fluctuation amount by increasing a luminance value of image data displayed in the display area as a whole.

The timing controller may increase the luminance value of the image data as a whole by using a gain value corresponding to the global current sensing value in a pre-stored lookup table.

The current summing circuit may include a single slope analog-to-digital converter (ADC) circuit configured to sum the current values of the sensing currents, which are analog values, and to output a summed value as the global current sensing value, which is a digital value, during the current sensing period.

A plurality of pixel circuits included in the display area may be in a driving state during the current sensing period.

The sensing current generating circuit may include: a driving transistor configured to generate the sensing current based on its gate-source voltage; a capacitor configured to charge the gate-source voltage of the driving transistor; and a plurality of switch transistors electrically connected to the driving transistor and the capacitor and configured to sample a threshold voltage of the driving transistor.

As described above, according to the present aspect, the display device may sense the global current flowing through a pixel array and compensate for the fluctuation of the global current based on the current value of the sensed global current, thereby improving luminance degradation due to accumulation of usage time of the display device.

Various useful advantages and effects of the aspects are not limited to the above-described contents and will be more easily understood from descriptions of the specific aspects.

BRIEF DESCRIPTION OF THE DRAWINGS

The above and other features and advantages of the present disclosure will become more apparent to those of ordinary skill in the art by describing exemplary aspects thereof in detail with reference to the attached drawings, in which:

FIG. 13 is a diagram exemplarily illustrating a lookup table stored in a display device according to one aspect of the present disclosure;

DETAILED DESCRIPTION

Figure 1:
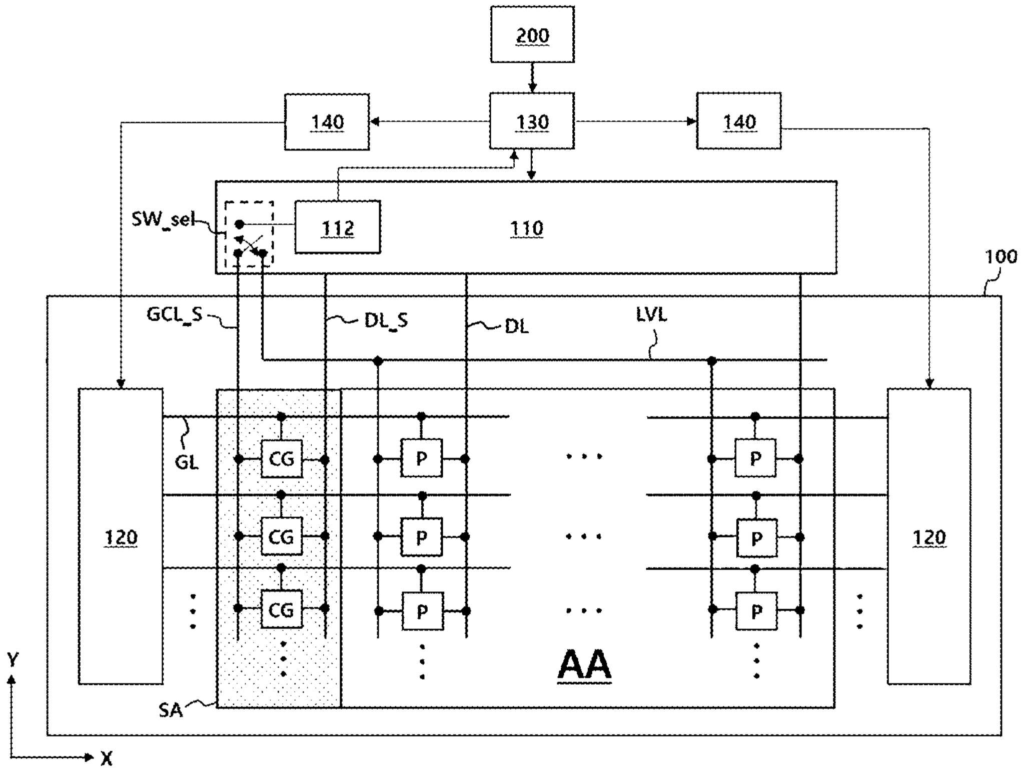
FIGS. 1 and 2 are block diagrams illustrating a display device according to one aspect of the present disclosure.

The advantages and features of the present disclosure and methods for accomplishing the same will be more clearly understood from aspects described below with reference to the accompanying drawings. However, the present disclosure is not limited to the following aspects but may be implemented in various different forms. Rather, the present aspects will make the disclosure of the present disclosure complete and allow those skilled in the art to completely comprehend the scope of the present disclosure. The present disclosure is only defined within the scope of the accompanying claims.

Shapes, sizes, ratios, angles, numbers, and the like disclosed in the drawings for describing the aspects of the present disclosure are exemplary, and the present disclosure is not limited to the illustrated items. Like reference numerals refer to like elements throughout. In addition, in describing the present disclosure, if it is determined that the detailed description of the related known technology may unnecessarily obscure the subject matter of the present disclosure, the detailed description thereof will be omitted.

The terms such as "comprising," "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

For the description of a positional relationship, for example, when the positional relationship and the interconnected relationship between two parts is described as "on," "above," "below," "next to," "connect or couple", "crossing or intersecting", and the like, one or more other parts may be interposed therebetween unless the term "immediately" or "directly" is used in the expression.

The terms "first," "second," and the like may be used to distinguish components from each other, but the functions or structures of the components are not limited by ordinal numbers or component names in front of the components. Because the claims are written around essential components, the ordinal numbers preceding the component names in the claims may not match the ordinal numbers preceding the component names in the aspects.

The following aspects may be partially or entirely bonded to or combined with each other and may be linked and operated in technically various ways. The aspects may be carried out independently of or in association with each other.

In a display device of the present disclosure, a display panel driving circuit, a pixel circuit, a level shifter, and the like may include transistors. The transistors may be implemented as oxide thin film transistors including oxide semiconductors, polycrystalline thin film transistors including low temperature poly silicon (LTPS), or the like.

A transistor is a three-terminal element including a gate, a source and a drain. The source is a terminal that supplies a carrier to the transistor. In the transistor, the carrier begins to flow from the source. A drain is a terminal through which the carrier flows out of the transistor. The flow of the carrier in the transistor flows from the source to the drain. In the case of an N-channel transistor, since the carrier is an electron, the source voltage has a voltage lower than the drain voltage so that electrons may flow from the source to the drain. In the N-channel transistor, the current flows from the drain to the source. In the case of a P-channel transistor, since the carrier is a hole, the source voltage is higher than the drain voltage so that the hole may flow from the source to the drain. In the P-channel transistor, current flows from the source to the drain because the hole flows from the source to the drain. It should be noted that the source and drain of the transistor are not fixed. For example, the source and drain may be changed according to the applied voltage. Therefore, the disclosure is not limited due to the source and drain of the transistor. In the following description, the source and drain of the transistor will be referred to as a first terminal and a second terminal.

The scan signal swings between a gate-on voltage and a gate-off voltage. The gate-off voltage may be interpreted as a first voltage, and the gate-on voltage may be interpreted as a second voltage. The transistor is turned on in response to the gate-on voltage, while the transistor is turned off in response to the gate-off voltage. In the case of an N-channel transistor, the gate-on voltage may be a gate high voltage (VGH), and the gate-off voltage may be a gate low voltage (VGL). In the case of a P-channel transistor, the gate-on voltage may be the gate low voltage (VGL), and the gate-off voltage may be the gate high voltage (VGH).

The present disclosure is applicable to any flat panel display device that requires an integrated circuit and a power circuit for driving pixels, such as an organic light emitting display (OLED), and the like.

Hereinafter, various aspects of the present disclosure will be described in detail with reference to the accompanying drawings.

Figure 2:
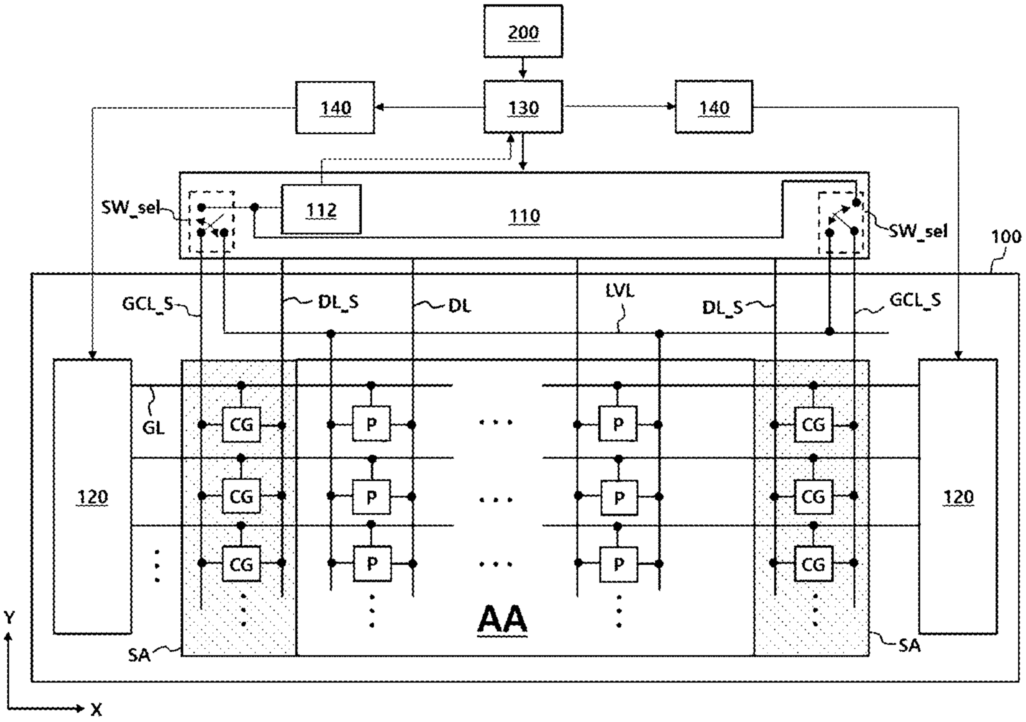

FIGS. 1 and 2 are block diagrams illustrating a display device according to one aspect of the present disclosure.

Referring to FIGS. 1 and 2, a display device according to one aspect includes a display panel 100 and a display panel driving circuit.

A display area AA of the display panel 100 includes a pixel array that displays an image. A data voltage corresponding to image data is inputted to pixel circuits P of the pixel array. The pixel array includes data lines DL, a plurality of gate lines GL intersecting the data lines DL, and the pixel circuits P arranged in a matrix form. The display panel 100 may further include a power line connected in common to the pixel circuits P. Here, the power line may include a low voltage power line LVL supplying low voltage power ELVSS, and a high voltage power line (not shown) supplying high voltage power ELVDD.

When the resolution of the pixel array is n (n being a natural number)×m (m being a natural number), the pixel array includes n pixel columns and m pixel lines intersecting the pixel columns. The pixel lines include the pixel circuits P arranged along a first direction X. The pixel column includes the pixel circuits P arranged along a second direction Y. In general, one horizontal period 1H may be a time obtained by dividing one frame period by m, which is the number of pixel lines. In one horizontal period 1H, the data voltage may be inputted to the pixel circuits P of one pixel line.

The pixel circuits P may be divided into two or more sub-pixel circuits for color implementation. For example, three pixel circuits sequentially arranged in the first direction X may be divided into a red sub-pixel circuit, a green sub-pixel circuit, and a blue sub-pixel circuit.

In addition, four pixel circuits sequentially arranged in the first direction X may be divided into a red sub-pixel circuit, a green sub-pixel circuit, a blue sub-pixel circuit, and a white sub-pixel circuit.

The pixel circuit P as described above is connected to the data line DL and the gate line GL. In one aspect, when the display device is an organic light emitting display device, the pixel circuit P is as shown in FIG. 7.

Figure 7:
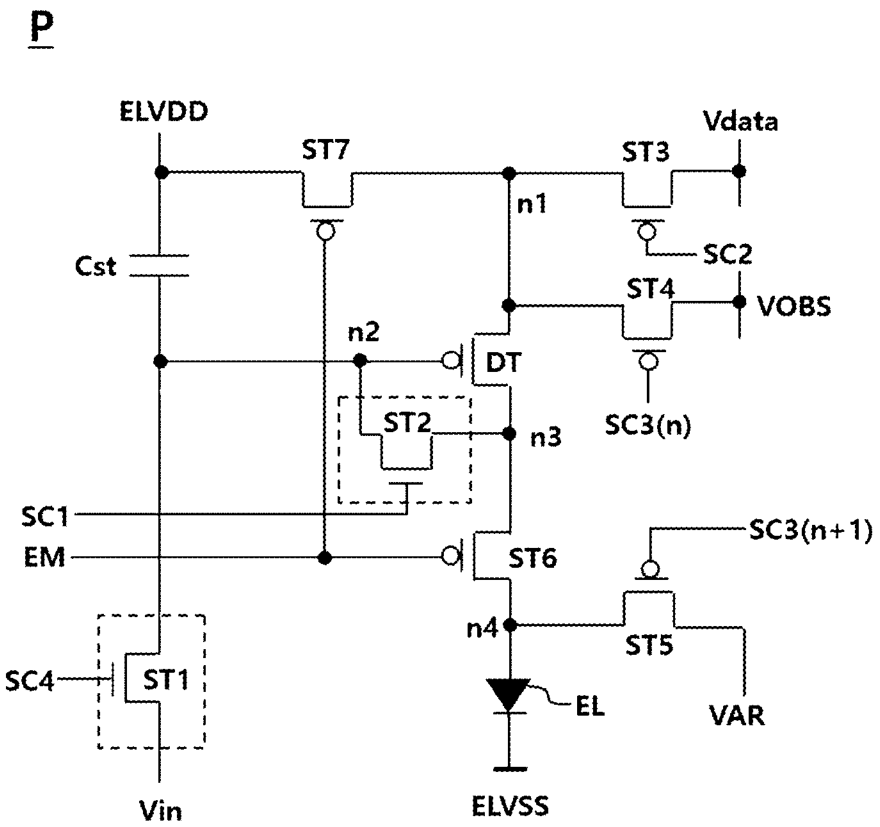
FIG. 7 is a diagram exemplarily illustrating a general pixel circuit.

Referring to FIG. 7, the pixel circuit P may include a light emitting element EL, a driving transistor DT that generates a driving current based on its gate-source voltage and supplies the driving current to the light emitting element EL, a capacitor Cst that is connected between a second node n2 and a node on the power line through which the high voltage power ELVDD is supplied and charges the gate-source voltage of the driving transistor DT, a plurality of switch transistors (e.g., ST1 and ST2) electrically connected to the driving transistor DT and the capacitor Cst to sample a threshold voltage of the driving transistor DT, and remaining switch transistors for driving the pixel. Although the pixel circuit P is illustrated as being composed of eight transistors and one capacitor in the drawing of the present disclosure, the present disclosure is not limited thereto. In other words, the pixel circuit P may include three or more transistors and one or more capacitors.

In FIG. 7, the light emitting element EL may be implemented as an OLED including an organic compound layer formed between an anode and a cathode. The organic compound layer may include a hole injection layer HIL, a hole transport layer HTL, an emission layer EML, an electron transport layer ETL, and an electron injection layer EIL, but is not limited thereto. When a voltage is applied to the anode and cathode terminals of the OLED, holes that have passed through the hole transport layer HTL and electrons that have passed through the electron transport layer ETL move to the emission layer EML to form excitons, and thus visible light is emitted from the emission layer EML. The OLED used as the light emitting element may have a tandem structure in which a plurality of emission layers are stacked. The OLED having a tandem structure may improve the luminance and lifespan of the pixel.

The display panel 100 may further include touch sensors. Here, the touch sensors may be disposed on the screen of the display panel 100 in an on-cell type or an add-on type.

The touch sensors may also be implemented in an in-cell type in which they are embedded in the pixel array.

In the present disclosure, the display panel driving circuit writes the image data to the pixel circuits P of the display panel 100 under the control of a timing controller 130. The display panel driving circuit may include a data driving circuit 110, a gate driving circuit 120, the timing controller 130 for controlling the operation timing of the driving circuits 110 and 120, and a level shifter 140 connected between the timing controller 130 and the gate driving circuit 120. The display panel driving circuit may further include a power supply (not shown) that outputs the low voltage power ELVSS, the high voltage power ELVDD, and the like. Here, the level shifter 140 may be included in the timing controller 130.

The data driving circuit 110 converts the image data received as a digital signal from the timing controller 130 into an analog gamma compensation voltage for each frame to output a data voltage. The data voltage outputted from the data driving circuit 110 is supplied to the corresponding data line. The data driving circuit 110 outputs the data voltage using a digital-to-analog converter that converts a digital signal into an analog gamma compensation voltage.

The data driving circuit 110 may be integrated into a source driver integrated circuit (SDIC). The source driver IC may be connected to a bonding pad of the display panel 100 using a tape automated bonding (TAB) method or a chip on glass (COG) method. The source driver IC may also be implemented using a chip on film (COF) method.

When the display panel 100 further includes the touch sensors, a touch sensor driving circuit for driving the touch sensors may be embedded in the source driver IC.

The gate driving circuit 120 may be formed in a non-display area (e.g., a bezel area) in which no image is displayed in the display panel 100, or may be at least partially disposed in the display area AA. The gate driving circuit 120 receives a clock signal from the level shifter 140 and outputs a scan signal to the gate line GL.

The switch transistors of the pixel circuits P connected to the gate line GL may be turned on in response to a gate-on voltage of the scan signal and turned off in response to a gate-off voltage.

Figure 3:
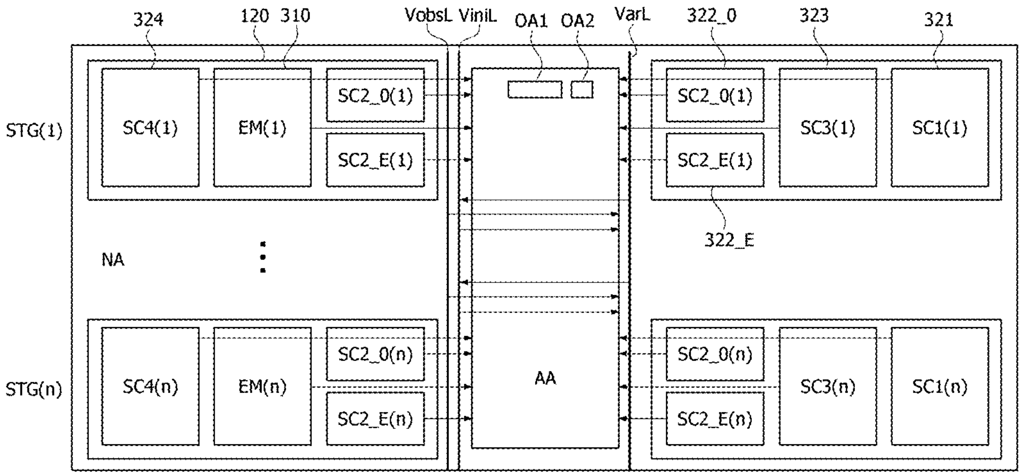
FIG. 3 is a diagram illustrating a configuration of a gate driving circuit according to one aspect of the present disclosure.

The gate driving circuit 120 may include a configuration as shown in FIG. 3.

Referring to FIG. 3, the gate driving circuit 120 includes an emission control signal driving circuit 310 and a scan driving circuit. The scan driving circuit may be composed of first to fourth scan driving circuits 321, 322, 323, and 324. In addition, the second scan driving circuit 322 may be composed of an odd-numbered second scan driving circuit 322_O and an even-numbered second scan driving circuit 322_E.

The gate driving circuit 120 may be configured symmetrically such that a shift register is formed on both sides of the display area AA. Further, the gate driving circuit 120 may be configured such that the shift register on one side of the display area AA includes the second scan driving circuit 322_O and 322_E, the fourth scan driving circuit 324, and the emission control signal driving circuit 310, and the shift register on the other side of the display area AA includes the first scan driving circuit 321, the second scan driving circuit 322_O and 322_E, and the third scan driving circuit 323. However, the present disclosure is not limited thereto, and the emission control signal driving circuit 310 and the first to fourth scan driving circuits 321, 322, 323, and 324 may be arranged differently according to an aspect.

Stages STG1 to STGn of the shift register may include first scan signal generating circuits SC1(1) to SC1(*n*), second scan signal generating circuits SC2_O(1) to SC2_O(n) and SC2_E(1) to SC2_E(n), third scan signal generating circuits SC3(1) to SC3(*n*), fourth scan signal generating circuits SC4(1) to SC4(*n*), and emission control signal generating circuits EM(1) to EM (n), respectively.

The first scan signal generating circuits SC1(1) to SC1(*n*) output first scan signals SC1(1) to SC1(*n*) through first gate lines of the display panel 100. The second scan signal generating circuits SC2(1) to SC2(*n*) output second scan signals SC2(1) to SC2(*n*) through second gate lines of the display panel 100. The third scan signal generating circuits SC3(1) to SC3(*n*) output third scan signals SC3(1) to SC3(*n*) through third gate lines of the display panel 100. The fourth scan signal generating circuits SC4(1) to SC4(*n*) output fourth scan signals SC4(1) to SC4(*n*) through fourth gate lines of the display panel 100. The emission control signal generating circuits EM(1) to EM(n) output emission control signals EM(1) to EM(n) through emission control lines of the display panel 100.

The first scan signals SC1(1) to SC1(*n*) may be used as signals for driving an Ath transistor (e.g., a compensation transistor and the like) included in the pixel circuit. The second scan signals SC2(1) to SC2(*n*) may be used as signals for driving a Bth transistor (e.g., a data supply transistor and the like) included in the pixel circuit. The third scan signals SC3(1) to SC3(*n*) may be used as signals for driving a Cth transistor (e.g., a bias transistor and the like) included in the pixel circuit. The fourth scan signals SC4(1) to SC4(*n*) may be used as signals for driving a Dth transistor (e.g., an initialization transistor and the like) included in the pixel circuit. The emission control signals EM(1) to EM(n) may be used as signals for driving an Eth transistor (e.g., an emission control transistor and the like) included in the pixel circuit. For example, when the emission control transistors of the pixels are controlled using the emission control signals EM(1) to EM(n), the emission time of the light emitting element is varied.

Referring to FIG. 3, a bias voltage bus line VobsL, a first initialization voltage bus line VarL, and a second initialization voltage bus line ViniL may be disposed between the gate driving circuit 120 and the display area AA.

The bias voltage bus line VobsL, the first initialization voltage bus line VarL, and the second initialization voltage bus line ViniL may supply a bias voltage Vobs, a first initialization voltage Var, and a second initialization voltage Vini from a power circuit of the display device to the pixel circuit, respectively.

In the drawing, the bias voltage bus line VobsL, the first initialization voltage bus line VarL, and the second initialization voltage bus line ViniL are shown as being positioned only on one side, either left or right, of the display area AA, but are not limited thereto, and they may be positioned on both sides of the display area AA. Furthermore, even if they are positioned on one side, their position is not limited to the left or right side.

Referring to FIG. 3, one or more optical regions OA1 and OA2 may be disposed in the display area AA.

The one or more optical regions OA1 and OA2 may be disposed to overlap one or more optical electronic devices, such as an imaging device such as a camera (image sensor), or a detection sensor such as a proximity sensor and an illuminance sensor.

For the operation of the optical electronic device, the one or more optical regions OA1 and OA2 may have a light transmitting structure formed therein to have a transmittance equal to or higher than a certain level. In other words, the number of pixels per unit area in the one or more optical regions OA1 and OA2 may be smaller than the number of pixels per unit area in a general region excluding the optical regions OA1 and OA2 in the display area AA. That is, the resolution of the one or more optical regions OA1 and OA2 may be lower than the resolution of the general region in the display area AA.

In the one or more optical regions OA1 and OA2, the light transmitting structure may be formed by patterning the cathode electrode in a portion where the pixel is not disposed. In this case, the patterned cathode electrode may be removed using a laser, or the cathode electrode may be selectively formed and patterned using a material such as a cathode deposition prevention layer.

In addition, the light transmitting structure in the one or more optical regions OA1 and OA2 may be formed by separating the light emitting element EL from the pixel circuit in the pixel. In other words, the light emitting element EL of the pixel may be located on the optical regions OA1 and OA2, and a plurality of transistors TFT constituting the pixel circuit may be disposed on the periphery of the optical regions OA1 and OA2, so that the light emitting element EL and the pixel circuit are electrically connected through a transparent metal layer.

The timing controller 130 may multiply an input frame frequency by i (i being a natural number) to control the operation timing of the display panel driving circuits 110 and 120 at a frame frequency of the input frame frequency×i Hz. The input frame frequency may be 60 Hz in a national television standards committee (NTSC) method, and 50 Hz in a phase-alternating line (PAL) method.

The timing controller 130 receives the image data and a timing signal synchronized therewith from the host system 200. The image data received by the timing controller 130 is a digital signal. The timing controller 130 may convert the image data to a data format used by the data driving circuit 110 and transmit it to the data driving circuit 110. Here, the timing signal may include a vertical synchronization signal, a horizontal synchronization signal, a clock signal, a data enable signal, and the like. Here, the data enable signal has a cycle of one horizontal period 1H.

Based on the timing signal received from the host system 200, the timing controller 130 may generate a data timing control signal for controlling the data driving circuit 110, a gate timing control signal for controlling the gate driving circuit 120, and the like. The gate timing control signal may be generated as a clock of a digital signal voltage level.

The host system 200 may be any one of a television, a set-top box, a navigation system, a personal computer (PC), a home theater, a mobile system, and a wearable system. In a mobile device and a wearable device, the data driving circuit 110, the timing controller 130, the level shifter 140, and the like may be integrated into a single drive IC (not shown). In a mobile system, the host system 200 may be implemented as an application processor (AP). The host system 200 may transmit the image data to the drive IC through a mobile industry processor interface (MIPI). The host system 200 may be connected to the drive IC through a flexible printed circuit board (FPCB).

In the present disclosure, the switch transistors of the pixel circuit P may be implemented as N-channel oxide thin film transistors.

In addition, some of the switch transistors of the pixel circuit P may be implemented as oxide thin film transistors with low off current, while the others may be implemented as polycrystalline thin film transistors with high on current characteristics.

For example, in FIG. 7, the switch transistors ST1 and ST2 (shown in dotted rectangles) electrically connected to the driving transistor DT and the capacitor Cst may be implemented as oxide thin film transistors, while the remaining transistors ST3 to ST7 may be implemented as polycrystalline thin film transistors.

Here, the off current may refer to a leakage current of the transistor. In addition, the oxide thin film transistor may be an N-channel transistor, and the polycrystalline thin film transistor may be a P-channel or an N-channel transistor.

The gate-on voltage of the N-channel oxide thin film transistor or the N-channel polycrystalline thin film transistor may be a gate high voltage and the gate-off voltage thereof may be a gate low voltage.

The gate-on voltage of the P-channel polycrystalline thin film transistor may be a gate low voltage and the gate-off voltage thereof may be a gate high voltage.

As described above, when the switch transistor is composed of an oxide thin film transistor or a polycrystalline thin film transistor, the display panel 100 may have a cross-sectional structure as shown below.

Figure 4:
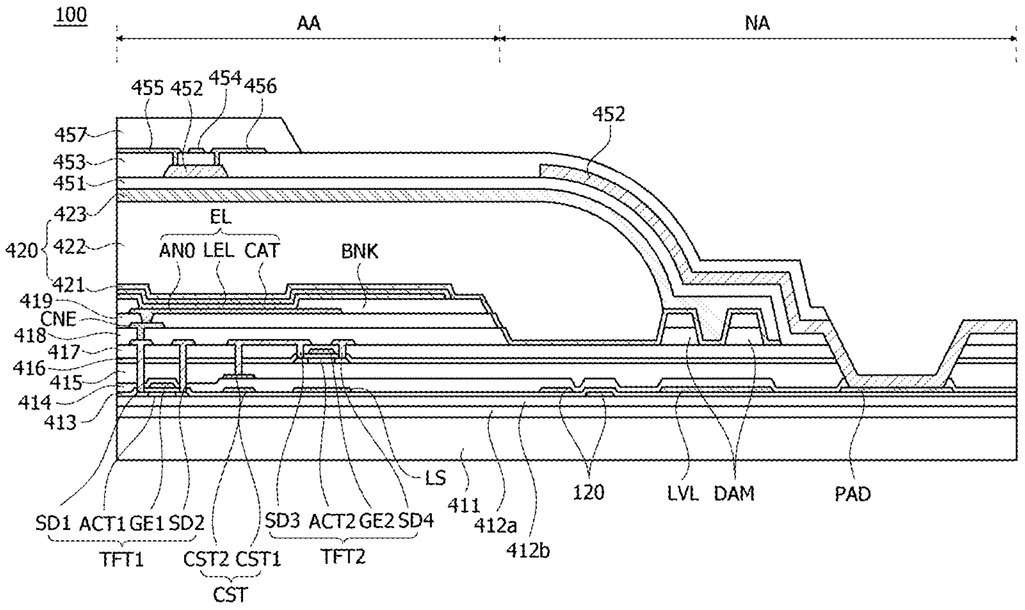
FIG. 4 is a cross-sectional view illustrating a stacked configuration of a display device according to one aspect of the present disclosure.

FIG. 4 is a cross-sectional view illustrating a stacked configuration of a display panel according to one aspect of the present disclosure.

In FIG. 4, the switch transistor will be referred to as a switching thin film transistor.

The cross-sectional view of FIG. 4 includes two switching thin film transistors TFT1 and TFT2 and one capacitor CST. The two switching thin film transistors TFT1 and TFT2 include a polycrystalline thin film transistor TFT1 containing a polycrystalline semiconductor material and an oxide thin film transistor TFT2 containing an oxide semiconductor material.

The polycrystalline thin film transistor TFT1 shown in FIG. 4 is an emission switching thin film transistor connected to the light emitting element EL, and the oxide thin film transistor TFT2 is any one switching thin film transistor connected to the capacitor CST.

In FIG. 4, one pixel includes the light emitting element EL and a pixel driving circuit that applies a driving current to the light emitting element EL. The pixel driving circuit is disposed on a substrate 411, and the light emitting element EL is disposed on the pixel driving circuit. In addition, an encapsulation layer 420 is disposed on the light emitting element EL. The encapsulation layer 420 protects the light emitting element EL.

The pixel driving circuit may refer to one pixel array portion including a driving thin film transistor, a switching thin film transistor, and a capacitor. In addition, the light emitting element EL may refer to an array portion for light emission including an anode electrode, a cathode electrode, and an emission layer disposed therebetween.

The substrate 411 may be implemented as a multi-layer in which an organic layer and an inorganic layer are alternately stacked. For example, the substrate 411 may be formed by alternately stacking an organic layer such as polyimide and an inorganic layer such as silicon oxide ($SiO_2$).

A lower buffer layer 412*a* is formed on the substrate 411. The lower buffer layer 412*a* is for blocking moisture or the like that may permeate from the outside, and may be used by stacking a silicon oxide ($SiO_2$) layer or the like in multiple layers. An auxiliary buffer layer 412*b* may be further disposed on the lower buffer layer 412*a* to protect the element from moisture permeation.

The polycrystalline thin film transistor TFT1 is formed above the substrate 411. The polycrystalline thin film transistor TFT1 may use a polycrystalline semiconductor as an active layer. The polycrystalline thin film transistor TFT1 includes a first active layer ACT1 having a channel through which electrons or holes move, a first gate electrode GE1, a first source electrode SD1, and a first drain electrode SD2.

The first active layer ACT1 includes a first channel region, a first source region disposed on one side of the first channel region, and a first drain region disposed on the other side of the first channel region.

The first source region and the first drain region are regions formed by doping Group 5 or Group 3 impurity ions, e.g., phosphorus (P) or boron (B), into an intrinsic polycrystalline semiconductor material at a predetermined concentration to form a conductor. The first channel region provides a path through which electrons or holes move by maintaining an intrinsic state of the polycrystalline semiconductor material.

Meanwhile, the polycrystalline thin film transistor TFT1 includes the first gate electrode GE1 overlapping the first channel region of the first active layer ACT1. A first gate insulating layer 413 is disposed between the first gate electrode GEL and the first active layer ACT1. The first gate insulating layer 413 may be used as a single layer or multiple layers of an inorganic layer such as a silicon oxide ($SiO_2$) layer and silicon nitride (SiNx) layer, or the like.

In one aspect, the polycrystalline thin film transistor TFT1 has a top gate structure in which the first gate electrode GE1 is positioned above the first active layer ACT1. Accordingly, a first electrode CST1 included in the capacitor CST and a light blocking layer LS included in the oxide thin film transistor TFT2 may be formed of the same material as the first gate electrode GE1. By forming the first gate electrode GE1, the first electrode CST1, and the light blocking layer LS by one mask process, the mask process may be reduced. However, the present disclosure is not limited thereto, the light blocking layer LS may be formed on the lower buffer layer 412*a* and the auxiliary buffer layer 412*b* by a separate mask process. In this case, the light blocking layer LS may be formed below any transistors, without being limited to the oxide thin film transistor TFT2. In addition, the light blocking layer LS may be disposed below the capacitor CST to overlap therewith to form a double capacitor.

The first gate electrode GE1 is made of a metallic material. For example, the first gate electrode GE1 may be a single layer or multiple layers made of one of molybdenum (Mo), aluminum (Al), chromium (Cr), gold (Au), titanium (Ti), nickel (Ni), neodymium (Nd), and copper (Cu), or an alloy thereof, but is not limited thereto.

A first interlayer insulating layer 414 is disposed on the first gate electrode GE1. The first interlayer insulating layer 414 may be formed of silicon oxide ($SiO_2$), silicon nitride (SiNx), or the like.

The display panel 100 may further include an upper buffer layer 415, a second gate insulating layer 416, and a second interlayer insulating layer 417 sequentially disposed on the first interlayer insulating layer 414. The polycrystalline thin film transistor TFT1 includes the first source electrode SD1 and the first drain electrode SD2 formed on the second interlayer insulating layer 417 and connected to the first source region and the first drain region, respectively.

The first source electrode SD1 and the first drain electrode SD2 may be a single layer or multiple layers made of one of molybdenum (Mo), aluminum (Al), chromium (Cr), gold (Au), titanium (Ti), nickel (Ni), neodymium (Nd), and copper (Cu), or an alloy thereof, but are not limited thereto.

The upper buffer layer 415 separates a second active layer ACT2 of the oxide thin film transistor TFT2 made of an oxide semiconductor material from the first active layer ACT1 made of a polycrystalline semiconductor material and provides a basis for forming the second active layer ACT2.

The second gate insulating layer 416 covers the second active layer ACT2 of the oxide thin film transistor TFT2. The second gate insulating layer 416 is formed on the second active layer ACT2 made of an oxide semiconductor material and thus is implemented as an inorganic layer. For example, the second gate insulating layer 416 may be formed of silicon oxide ($SiO_2$), silicon nitride (SiNx), or the like.

A second gate electrode GE2 is made of a metallic material. For example, the second gate electrode GE2 may be a single layer or multiple layers made of one of molybdenum (Mo), aluminum (Al), chromium (Cr), gold (Au), titanium (Ti), nickel (Ni), neodymium (Nd), and copper (Cu), or an alloy thereof, but is not limited thereto.

Meanwhile, the oxide thin film transistor TFT2 includes the second active layer ACT2 formed on the upper buffer layer 415 and made of an oxide semiconductor material, the second gate electrode GE2 disposed on the second gate insulating layer 416, and a second source electrode SD3 and a second drain electrode SD4 disposed on the second interlayer insulating layer 417.

The second active layer ACT2 is made of an oxide semiconductor material and includes an intrinsic second channel region that is not doped with impurities, and a second source region and a second drain region that are doped with impurities to become conductors.

The oxide thin film transistor TFT2 further includes the light blocking layer LS located below the upper buffer layer 415 and overlapping the second active layer ACT2. The light blocking layer LS may block light incident on the second active layer ACT2 to ensure the reliability of the oxide thin film transistor TFT2. The light blocking layer LS is made of the same material as the first gate electrode GE1 and may be formed on the top surface of the first gate insulating layer 413. The light blocking layer LS may be electrically connected to the second gate electrode GE2 to form a dual gate.

The second source electrode SD3 and the second drain electrode SD4 may be simultaneously formed together with the first source electrode SD1 and the first drain electrode SD2 on the second interlayer insulating layer 417 using the same material, thereby reducing the number of mask processes.

Meanwhile, the capacitor CST may be realized by disposing a second electrode CST2 on the first interlayer insulating layer 414 to overlap the first electrode CST1. The second electrode CST2 may be a single layer or multiple layers made of any one of, for example, molybdenum (Mo), aluminum (Al), chromium (Cr), gold (Au), titanium (Ti), nickel (Ni), neodymium (Nd), and copper (Cu), or an alloy thereof.

The capacitor CST stores the data voltage applied through the data line DL for a certain period of time and provides it to the light emitting element EL. The capacitor CST includes two electrodes corresponding to each other and a dielectric disposed therebetween. The first interlayer insulating layer 414 is positioned between the first electrode CST1 and the second electrode CST2.

The first electrode CST1 or the second electrode CST2 of the capacitor CST may be electrically connected to the second source electrode SD3 or the second drain electrode SD4 of the oxide thin film transistor TFT2. However, the present disclosure is not limited thereto, and the connection relationship of the capacitor CST may vary depending on the pixel driving circuit.

Meanwhile, a first planarization layer 418 and a second planarization layer 419 are sequentially disposed on the pixel driving circuit to planarize the top of the pixel driving circuit. The first planarization layer 418 and the second planarization layer 419 may be an organic layer such as polyimide or acrylic resin.

Then, the light emitting element EL is formed on the second planarization layer 419.

The light emitting element EL includes an anode electrode ANO, a cathode electrode CAT, and an emission layer LEL disposed between the anode electrode ANO and the cathode electrode CAT. When implemented in a pixel driving circuit that uses in common a low potential voltage connected to the cathode electrode CAT, the anode electrode ANO is disposed as a separate electrode for each sub-pixel. When implemented in a pixel driving circuit that uses a high potential voltage in common, the cathode electrode CAT may be disposed as a separate electrode for each sub-pixel.

The light emitting element EL is electrically connected to a driving element through an intermediate electrode CNE disposed on the first planarization layer 418. Specifically, the anode electrode ANO of the light emitting element EL and the first source electrode SD1 of the polycrystalline thin film transistor TFT1 constituting the pixel driving circuit are connected to each other through the intermediate electrode CNE.

The anode electrode ANO is connected to the intermediate electrode CNE exposed through a contact hole penetrating the second planarization layer 419. In addition, the intermediate electrode CNE is connected to the first source electrode SD1 exposed through a contact hole penetrating the first planarization layer 418.

The intermediate electrode CNE acts as a medium connecting the first source electrode SD1 to the anode electrode ANO. The intermediate electrode CNE may be made of a conductive material such as copper (Cu), silver (Ag), molybdenum (Mo), or titanium (Ti).

The anode electrode ANO may be formed in a multilayer structure including a transparent conductive layer and an opaque conductive layer having high reflection efficiency. The transparent conductive layer may be made of a material, such as indium-tin-oxide (ITO) or indium-zinc-oxide (IZO), having a relatively large work function value, while the opaque conductive layer may be formed in a single-layer or multilayer structure containing aluminum (Al), silver (Ag), copper (Cu), lead (Pb), molybdenum (Mo), titanium (Ti), or an alloy thereof. For example, the anode electrode ANO may be formed in a structure in which a transparent conductive layer, an opaque conductive layer, and a transparent conductive layer are sequentially stacked, or a structure in which a transparent conductive layer and an opaque conductive layer are sequentially stacked.

The emission layer LEL is formed by stacking a hole-related layer, an organic emission layer, and an electron-related layer on the anode electrode ANO in that order or in reverse order.

The bank layer BNK may be a pixel defining layer that exposes the anode electrode ANO of each pixel. The bank layer BNK may be made of an opaque material (e.g., black) to prevent light interference between adjacent pixels. In this case, the bank layer BNK contains a light blocking material made of at least one of a color pigment, organic black, and carbon. A spacer may be further disposed on the bank layer BNK.

The cathode electrode CAT is formed opposite to the anode electrode ANO with the emission layer LEL interposed therebetween, and is formed on the top surface and side surface of the emission layer LEL. The cathode electrode CAT may be integrally formed over the entire display area AA. When applied to a top emission type organic light emitting display device, the cathode electrode CAT may be formed of a transparent conductive layer such as indium-tin-oxide (ITO) or indium-zinc-oxide (IZO).

The encapsulation layer 420 for suppressing moisture permeation may be further disposed on the cathode electrode CAT.

The encapsulation layer 420 may block the permeation of external moisture or oxygen into the light emitting element EL, which is vulnerable to external moisture or oxygen. To achieve this, the encapsulation layer 420 may include at least one layer of inorganic encapsulation layer and at least one layer of organic encapsulation layer, but is not limited thereto. In the present disclosure, the structure of the encapsulation layer 420 in which a first encapsulation layer 421, a second encapsulation layer 422, and a third encapsulation layer 423 are sequentially stacked will be described as an example.

The first encapsulation layer 421 is formed over the substrate 411 over which the cathode electrode CAT is formed. The third encapsulation layer 423 is formed over the substrate 411 over which the second encapsulation layer 422 is formed, and may be formed to surround the top, bottom, and side surfaces of the second encapsulation layer 422 together with the first encapsulation layer 421. The first encapsulation layer 421 and the third encapsulation layer 423 may minimize or prevent the permeation of external moisture or oxygen into the light emitting element EL. The first encapsulation layer 421 and the third encapsulation layer 423 may be made of an inorganic insulating material, such as silicon nitride (SiNx), silicon oxide (SiOx), silicon oxynitride (SiON), and aluminum oxide ($Al_2O_3$), capable of low temperature deposition. Since the first encapsulation layer 421 and the third encapsulation layer 423 are deposited in a low temperature atmosphere, it is possible to prevent the light emitting element EL, which is vulnerable to a high temperature atmosphere, from being damaged during the deposition process of the first encapsulation layer 421 and the third encapsulation layer 423.

The second encapsulation layer 422 may serve as a buffer to relieve stress between layers caused by the bending of the display device 40, and may planarize a step difference between layers. The second encapsulation layer 422 may be formed of a non-photosensitive organic insulating material such as acrylic resin, epoxy resin, phenolic resin, polyamide resin, polyimide resin, polyethylene, and silicon oxycarbide (SiOC), or a photosensitive organic insulating material such as photoacrylic, above the substrate 411 over which the first encapsulation layer 421 is formed, but is not limited thereto. When the second encapsulation layer 422 is formed by an inkjet method, a dam DAM may be disposed to prevent the second encapsulation layer 422 in liquid form from diffusing to the edge of the substrate 411. The DAM may be disposed closer to the edge of the substrate 411 than the second encapsulation layer 422. Due to the dam DAM, the second encapsulation layer 422 may be prevented from diffusing to a pad region having a conductive pad disposed at the outermost portion of the substrate.

The dam DAM is designed to prevent the diffusion of the second encapsulation layer 422, but if the second encapsulation layer 422 is formed to exceed the height of the dam DAM during the process, the second encapsulation layer 422, which is an organic layer, may be exposed to the outside, which may facilitate the permeation of moisture or the like into the light emitting element. Therefore, to prevent this, at least ten or more dams DAM may be formed in an overlapping manner.

The dam DAM may be disposed on the second interlayer insulating layer 417 of a non-display area NA.

In addition, the dam DAM may be formed simultaneously with the first planarization layer 418 and the second planarization layer 419. When the first planarization layer 418 is formed, a lower layer of the dam DAM may be formed together, and when the second planarization layer 419 is formed, an upper layer of the dam DAM may be formed together, and they may be stacked in a double structure.

Therefore, the DAM may be made of the same material as the first planarization layer 418 and the second planarization layer 419, but is not limited thereto.

The DAM may be formed to overlap the low voltage power line LVL. For example, in the non-display area NA, the low voltage power line LVL may be formed in a lower layer of an area in which the DAM is located.

The low voltage power line LVL and the gate driving circuit 120 configured in the form of a gate in panel (GIP) may be formed to surround the outer periphery of the display panel, and the low voltage power line LVL may be positioned further outward than the gate driving circuit 120. In addition, the low voltage power line LVL may be connected to the cathode electrode CAT to apply a common voltage. The gate driving circuit 120 is depicted simply in the plan and cross-sectional views of the drawings, but may be configured using a thin film transistor with the same structure as the thin film transistor of the display area AA.

The low voltage power line LVL is disposed further outward than the gate driving circuit 120. The low voltage power line LVL is disposed further outward than the gate driving circuit 120 and surrounds the display area AA. For example, the low voltage power line LVL may be made of the same material as the first gate electrode GE1, but is not limited thereto, and may be made of the same material as the second electrode CST2 or the first source and drain electrodes SD1 and SD2, but is not limited thereto.

Further, the low voltage power line LVL may be electrically connected to the cathode electrode CAT. The low voltage power line LVL may supply the low voltage power ELVSS to the pixels in the display area AA.

A touch layer may be disposed on the encapsulation layer 420. In the touch layer, a touch buffer layer 451 may be positioned between a touch sensor metal including touch electrode connection lines 452 and 454 and touch electrodes 455 and 456, and the cathode electrode CAT of the light emitting element EL.

The touch buffer layer 451 may prevent a chemical solution (developer, etchant, or the like) used in the manufacturing process of the touch sensor metal disposed on the touch buffer layer 451, moisture from the outside, or the like from permeating the emission layer LEL containing an organic material. Accordingly, the touch buffer layer 451 may prevent damage to the light emitting element LEL, which is susceptible to chemical solution or moisture.

The touch buffer layer 451 may be formed of an organic insulating material capable of being formed at a low temperature equal to or less than a certain temperature (e.g., 100° C.) and having a low dielectric constant of 1 to 3, to prevent damage to the emission layer LEL containing an organic material that is susceptible to high temperature. For example, the touch buffer layer 451 may be formed of an acrylic-based, epoxy-based, or siloxane-based material. The touch buffer layer 451 having a planarization performance made of an organic insulating material may prevent damage to the encapsulation layer 420 and cracking of the touch sensor metal formed on the touch buffer layer 451 caused by bending of the organic light emitting display device.

According to a mutual-capacitance-based touch sensor structure, the touch electrodes 455 and 456 may be disposed above the touch buffer layer 451, and the touch electrodes 455 and 456 may be disposed to cross each other.

The touch electrode connection lines 452 and 454 may electrically connect the touch electrodes 455 and 456 to each other. The touch electrode connection lines 452 and 454 and the touch electrodes 455 and 456 may be positioned on different layers with a touch insulating layer 453 interposed therebetween.

The touch electrode connection lines 452 and 454 may be disposed to overlap the bank layer BNK to prevent a decrease in aperture ratio.

Meanwhile, a portion of the touch electrode connection line 452 may be electrically connected to a touch driving circuit (not shown) through a touch pad PAD beyond the top portion and the side surface of the encapsulation layer 420 and the top portion and the side surface of the dam DAM.

A portion of the touch electrode connection line 452 may receive a touch driving signal from the touch driving circuit and transmit it to the touch electrodes 455 and 456, and may also transmit a touch sensing signal from the touch electrodes 455 and 456 to the touch driving circuit.

A touch passivation layer 457 may be disposed on the touch electrodes 455 and 456. Although the touch passivation layer 457 is shown as being disposed only on the touch electrodes 455 and 456, the present disclosure is not limited thereto, and the touch passivation layer 457 may extend before or after the dam DAM to be disposed on the touch electrode connection line 452.

In addition, a color filter (not shown) may be further disposed on the encapsulation layer 420, and the color filter may be positioned on the touch layer, or may be positioned between the encapsulation layer 420 and the touch layer.

On the other hand, since the oxide thin film transistor is subjected to more stress from temperature, light, and the like than the polycrystalline thin film transistor, the electrical characteristics such as the threshold voltage of the oxide thin film transistor change as the usage time of the display device is accumulated.

When the electrical characteristics of the oxide thin film transistor change, a global current, which is a total current flowing through the pixel array of the display area AA, may decrease, resulting in an overall degradation of the luminance of the display device. Here, the stress may be one or more of positive bias temperature stress (PBTS), negative bias temperature stress (NBTS), and negative bias temperature illumination stress (NBTiS).

In the present disclosure, a plurality of sensing current generating circuits CG for sensing the global current of the pixel array, i.e., the global current of the display area AA, may be disposed on one side of the display area AA to sense the global current of the display area AA. Here, the global current of the display area AA may gradually decrease as the usage time of the display device is accumulated. Therefore, by repeatedly sensing the global current with a time difference, the fluctuation in the global current of the display area AA may be checked and the fluctuation in the global current may be compensated.

Specifically, the display device according to one aspect of the present disclosure may include a global sensing current generating circuit capable of sensing a global current in the display area AA.

Referring to FIG. 1, the global sensing current generating circuit may include the plurality of sensing current generating circuits CG, a single current sensing line GCL_S, a switch circuit SW_sel, a current sensing data line DL_S, and a current summing circuit 112.

Figure 5:
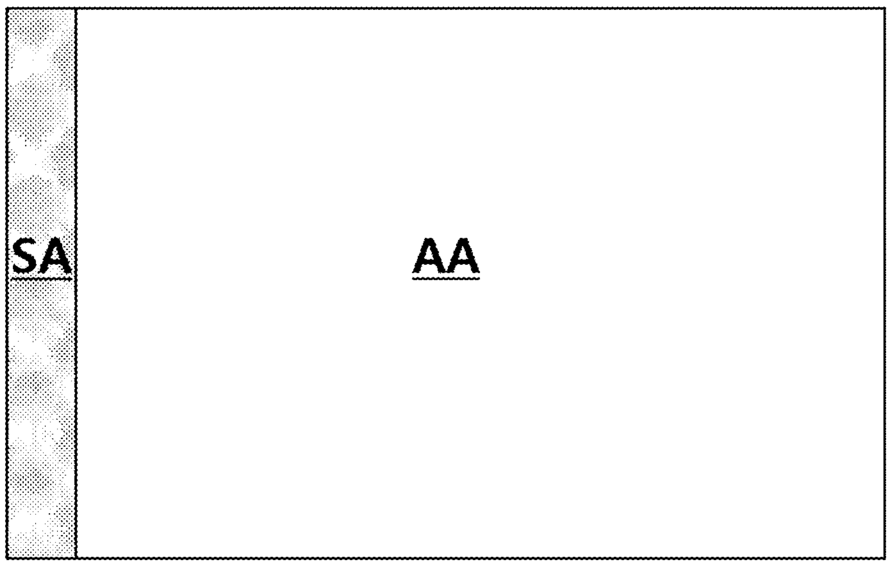
FIGS. 5 and 6 are diagrams illustrating an arrangement position of a sensing area according to one aspect of the present disclosure.
Figure 6:
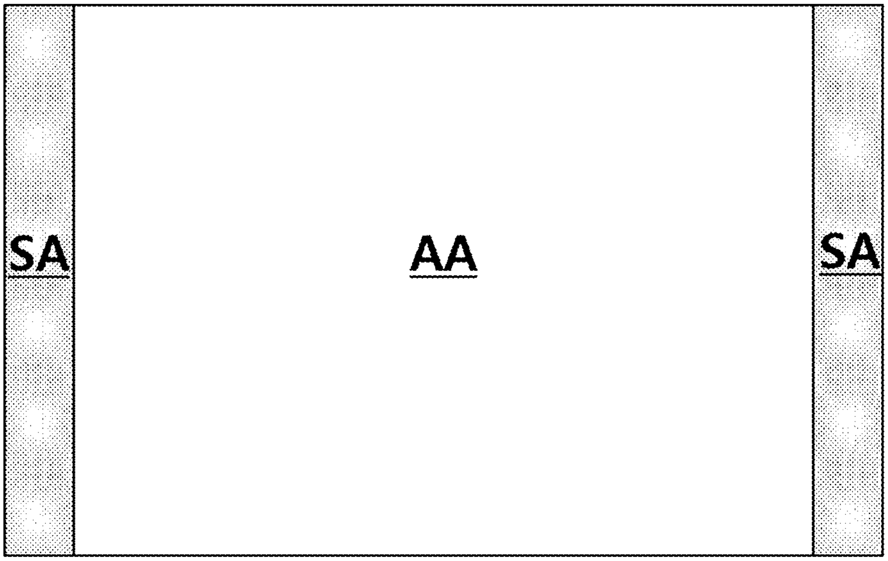

In one aspect of the present disclosure, a sensing area SA in which the plurality of sensing current generating circuits CG are disposed may be positioned on one side of the display area AA as shown in FIGS. 1 and 5, or may also be positioned on the other side of the display area AA as shown in FIGS. 2 and 6.

When the sensing area SA is positioned on one side and the other side of the display area AA, as shown in FIG. 2, the plurality of sensing current generating circuits CG, the single current sensing line GCL_S, the switch circuit SW_sel, and the current sensing data line DL_S may be disposed to both sides of the display area AA.

The plurality of sensing current generating circuits CG may be disposed adjacent to one side of the display area AA, and may be supplied with a current sensing data voltage during a current sensing period.

Alternatively, the plurality of sensing current generating circuits CG may be disposed adjacent to both sides of the display area AA and may be supplied with a current sensing data voltage during a current sensing period. Here, the plurality of sensing current generating circuits CG may be disposed in the second direction Y on one side or both sides of the display area AA. In other words, the plurality of sensing current generating circuits CG may be disposed in the form of a pixel column. Although FIGS. 1 and 2 illustrate that the plurality of sensing current generating circuits CG are disposed in the form of one pixel column on one side or both sides of the display area AA, the present disclosure is not limited thereto, and the plurality of sensing current generating circuits CG may be disposed in the form of two or more pixel columns.

In the present disclosure, when the display area AA includes m pixel lines, since one or more sensing current generating circuits CG may be disposed on one side or both sides of each pixel line, the number of sensing current generating circuits CG may be an integer multiple of m.

Here, the plurality of pixel circuits P are disposed in the display area AA. The pixel circuits P may include, as shown in FIG. 7, the light emitting element EL, the capacitor Cst, the driving transistor DT, the plurality of switch transistors (e.g., ST1 and ST2), and the remaining switch transistors ST3 to ST7.

Figure 8:
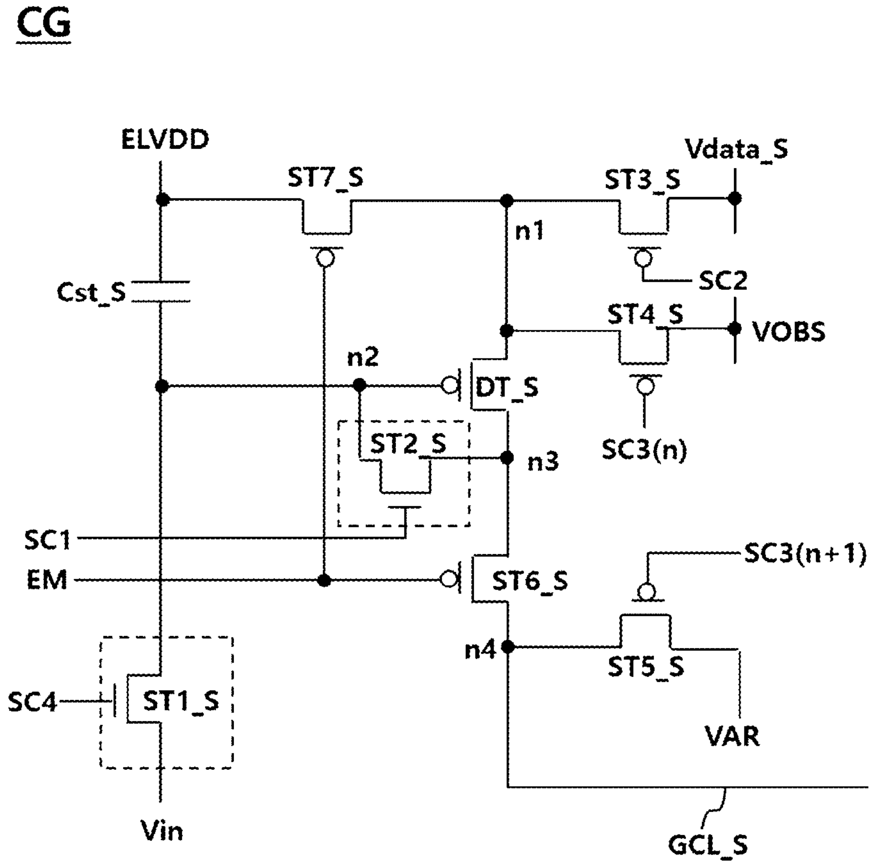
FIG. 8 is a diagram exemplarily illustrating a sensing current generating circuit according to one aspect of the present disclosure.

The sensing current generating circuit CG includes, as shown in FIG. 8, a sensing driving transistor DT_S that generates a sensing current based on its gate-source voltage, a sensing capacitor Cst_S that charges the gate-source voltage of the sensing driving transistor DT_S, a plurality of sensing switch transistors (e.g., ST1_S and ST2_S) electrically connected to the sensing driving transistor DT_S and the sensing capacitor Cst_S to sample the threshold voltage of the sensing driving transistor, and remaining sensing switch transistors ST3_S to ST7_S. In addition, the sensing current generating circuit CG does not include a light emitting element.

The sensing driving transistor DT_S is the same type of transistor as the driving transistor DT, and the plurality of sensing switch transistors ST1_S and ST2_S are the same type of transistors as the plurality of switch transistors ST1 and ST2. The remaining sensing switch transistors ST3_S to ST7_S are also the same type of transistors as the remaining switch transistors ST3 to ST7.

The number of the sensing switch transistors ST1_S and ST2_S is the same as the number of the switch transistors ST1 and ST2, and the number of the remaining sensing switch transistors ST3_S to ST7_S is the same as the number of the remaining switch transistors ST3 to ST7.

In addition, the plurality of switch transistors ST1 and ST2 and one or more sensing switch transistors ST1_S and ST2_S may be oxide thin film transistors, while the remaining switch transistors ST3 to ST7 and the remaining sensing switch transistors ST3_S to ST7_S may be polycrystalline thin film transistors.

In other words, the sensing current generating circuit CG has the same components as the pixel circuit P except for the light emitting element.

In FIG. 1, the single current sensing line GCL_S is commonly connected to the plurality of sensing current generating circuits CG.

The switch circuit SW_sel is disposed at one end of the single current sensing line GCL_S.

The switch circuit SW_sel electrically connects the single current sensing line GCL_S to the current summing circuit 112 in the current sensing period, and electrically connects the single current sensing line GCL_S to the low voltage power line LVL that is commonly connected to the plurality of pixel circuits in a period other than the current sensing period. Here, the low voltage power line LVL is a line for supplying the low voltage power ELVSS. The low voltage power ELVSS may be set to −5V, but is not limited thereto.

Although not shown in FIG. 1, the gate line GL for supplying the scan signal, the high voltage power line (not shown) for supplying the high voltage power ELVDD, and the like are equally connected to the pixel circuit P and the sensing current generating circuit CG.

Therefore, when the plurality of pixel circuits P are driven while the switch circuit SW_sel electrically connects the low voltage power line LVL to the single current sensing line GCL_S, the transistors of the plurality of sensing current generating circuits CG disposed adjacent to the display area AA and the transistors of the plurality of pixel circuits P may operate in the same manner.

As a result, the oxide thin film transistor in the sensing current generating circuit CG is subjected to the same level of stress as the oxide thin film transistors in the pixel circuit P.

In other words, when the plurality of pixel circuits P are driven in a state in which the low voltage power line LVL and the single current sensing line GCL_S are electrically connected by the switch circuit SW_sel, at least one of positive bias stress and negative bias stress may be accumulated in the plurality of switch transistors ST1 and ST2 and the plurality of sensing switch transistors ST1_S and ST2_S. Here, the positive bias stress may be a positive bias temperature stress (PBTS), a positive bias temperature illumination stress (PBTiS), or the like, and the negative bias stress may be a negative bias temperature stress (NBTS), a negative bias temperature illumination stress (NBTiS), or the like.

Meanwhile, the current sensing data line DL_S is commonly connected to the plurality of sensing current generating circuits CG, and supplies the current sensing data voltage to the plurality of sensing current generating circuits CG during the current sensing period. Here, the current sensing data voltage may be outputted from the data driving circuit 110.

The current summing circuit 112 receives sensing currents generated by the plurality of sensing current generating circuits CG during the current sensing period through the single current sensing line GCL_S, and outputs a global current sensing value obtained by summing the current values of the sensing currents.

Here, since the plurality of sensing current generating circuits CG are disposed in the form of a pixel column and connected to the corresponding gate line GL, the sensing currents may be sequentially generated and outputted in a direction from the top to the bottom or from the bottom to the top of the display panel 100. In addition, the current summing circuit 112 may sequentially receive the sensing currents through the single current sensing line GCL_S.

The current summing circuit 112 may include an analog-to-digital converter (ADC) circuit that sums the current values of the sensing currents, which are analog values, and outputs the summed value as a global current sensing value, which is a digital value, during the current sensing period. Here, the ADC circuit may be a single slope ADC circuit, which is an integral ADC circuit. In addition, the sensing current may be a driving current of the sensing current generating circuit CG in which stress accumulated in one or more sensing switch transistors, i.e., one or more oxide thin film transistors, is reflected.

In the global sensing current generating circuit described above, the plurality of sensing current generating circuits CG, the single current sensing line GCL_S, and the current sensing data line DL_S may be disposed in the display panel 100 including the display area AA, and the switch circuit SW_sel and the current summing circuit 112 may be disposed in the data driving circuit 110 that supplies the data voltage to the plurality of pixel circuits P.

Meanwhile, the global current sensing value outputted from the current summing circuit 112 may be received by the timing controller 130.

Upon receiving the global current sensing value, the timing controller 130 may use the global current sensing value to check the global current fluctuation amount in the display area AA. The timing controller 130 may then compensate for the global current fluctuation amount. A detailed description thereof will be provided with reference to FIGS. 12 and 13.

Hereinafter, a driving method of the global sensing current generating circuit will be described.

Figure 9:
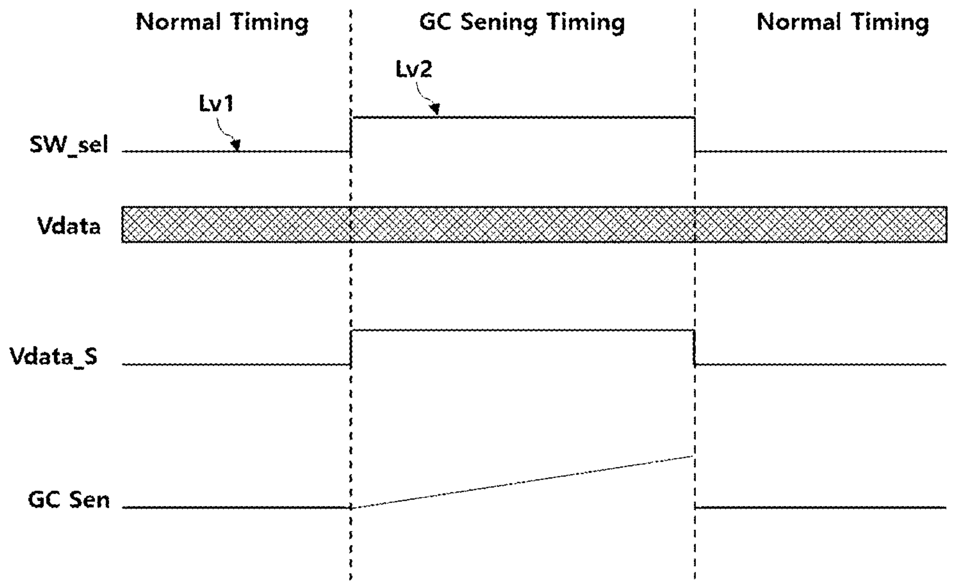
FIG. 9 is a diagram illustrating a driving method of a global sensing current generating circuit according to one aspect of the present disclosure.

FIG. 9 is a diagram illustrating a driving method of a global sensing current generating circuit according to one aspect of the present disclosure.

Referring to FIG. 9, a switching signal at a first voltage level Lv1 may be inputted to the switch circuit SW_sel of the global sensing current generating circuit during a normal period (Normal Timing), which is a period other than the current sensing period (GC Sensing Timing). The switch circuit SW_sel that has received the switching signal at the first voltage level Lv1 may electrically connect the single current sensing line GCL_S to the low voltage power line LVL.

In addition, during the normal period (Normal Timing), a current sensing data voltage Vdata_S is not supplied to the plurality of sensing current generating circuits CG.

However, when the plurality of pixel circuits P are driven, the scan signal, the high voltage power ELVDD, and the like supplied to the plurality of pixel circuits P are also supplied to the plurality of sensing current generating circuits CG, and thus when the plurality of pixel circuits P are driven during the normal period (Normal Timing), the transistors of the plurality of sensing current generating circuits CG disposed adjacent to the display area AA and the transistors of the plurality of pixel circuits P may operate in the same manner.

Accordingly, stress at the same level as the positive bias stress or the negative bias stress accumulated in the oxide thin film transistor of the pixel circuit P is also accumulated in the oxide thin film transistor of the sensing current generating circuit CG. Here, in the normal period (Normal Timing), a data voltage Vdata is supplied to the plurality of pixel circuits P and the current sensing data voltage Vdata_S is not supplied to the plurality of sensing current generating circuits CG. However, whether or not the data voltage is supplied may not significantly affect the stress of the oxide thin film transistor.

This is because the oxide thin film transistor is sensitive to negative bias stress received while the transistor is turned off, and thus the change in electrical characteristics due to negative bias stress mainly occurs.

As described above, as the switch circuit SW_sel electrically connects the single current sensing line GCL_S to the low voltage power line LVL during the normal period (Normal Timing), stress at the same level as that of the plurality of pixel circuits P may be accumulated in the plurality of sensing current generating circuits CG.

On the other hand, in the current sensing period (GC Sensing Timing), a switching signal at a second voltage level Lv2 may be inputted to the switch circuit SW_sel. The switch circuit SW_sel that has received the switching signal at the second voltage level Lv2 may electrically connect the single current sensing line GCL_S to the current summing circuit 112.

In addition, in the current sensing period (GC Sensing Timing), the current sensing data voltage Vdata_S may be supplied to the plurality of sensing current generating circuits CG. Here, the current sensing data voltage Vdata_S supplied to each of the plurality of sensing current generating circuits CG may have the same voltage value. For example, the current sensing data voltage Vdata_S may have a voltage value corresponding to a luminance of 600 nits.

In addition, by the scan signals sequentially outputted by the gate driving circuit 120, the current sensing data voltage Vdata_S may be sequentially supplied to the plurality of sensing current generating circuits CG.

The plurality of sensing current generating circuits CG supplied with the current sensing data voltage Vdata_S may each generate a sensing current.

The sensing currents generated by the plurality of sensing current generating circuits CG are inputted to the current summing circuit 112 through the single current sensing line GCL_S. Here, the plurality of sensing current generating circuits CG may sequentially generate and output the sensing currents, and the current summing circuit 112 may sequentially receive the sensing currents through the single current sensing line GCL_S. Here, the sensing current may be a driving current of the sensing current generating circuit CG in which stress accumulated in one or more sensing switch transistors, i.e., one or more oxide thin film transistors, included in the sensing current generating circuit CG is reflected.

The current summing circuit 112 that has received the sensing currents sums the current values of the sensing currents and outputs the summed value as a global current sensing value GC Sen. Here, since the sensing currents are inputted sequentially, the global current sensing value GC Sen may increase linearly during the current sensing period (GC Sensing Timing).

In addition, at the end of the current sensing period (GC Sensing Timing) in which all of the sensing currents are inputted to the current summing circuit 112, the global current sensing value GC Sen outputted from the current summing circuit 112 may be used as the global current sensing value of the display area AA.

In other words, since the pixel circuit P and the sensing current generating circuit CG included in each pixel line have the same transistor configuration and accumulate stress at the same level, the driving current generated in the plurality of pixel circuits P and the sensing current generated in the plurality of sensing current generating circuits CG may be the same or very similar. Therefore, the global current value of the display area AA may be replaced with a value obtained by summing all sensing currents generated in the plurality of sensing current generating circuits CG.

The global sensing current generating circuit may sense the global current value of the display area AA through the above method. In addition, the global sensing current generating circuit may repeat the current sensing period (GC Sensing Timing) with a time difference. Here, the time difference may be a constant period or an irregular period such as a turn-on time point or a turn-off time point of the display device.

On the other hand, the plurality of sensing current generating circuits CG do not emit light by the current sensing data voltage since they do not include the light emitting element EL. Therefore, the current sensing period (GC Sensing Timing) may proceed independently of the driving of the plurality of pixel circuits P.

In other words, the current sensing period (GC Sensing Timing) may proceed while the plurality of pixel circuits P are driven by the data voltage Vdata as shown in FIG. 9, or the current sensing period (GC Sensing Timing) may proceed while the plurality of pixel circuits P are not driven.

Figure 10:
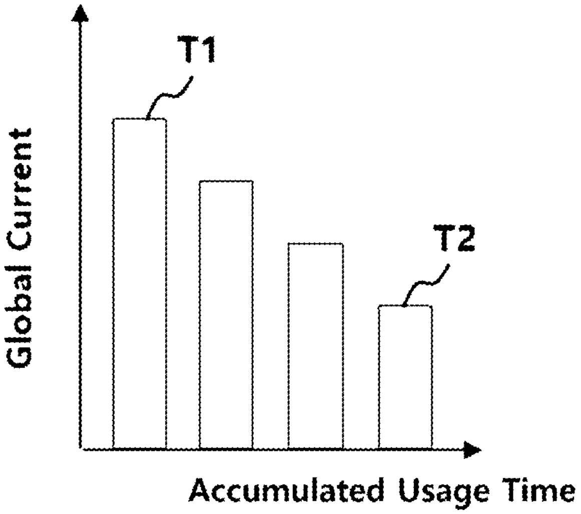
FIGS. 10 and 11 are diagrams illustrating a fluctuation of a global current according to an accumulation of use of a display device.
Figure 11:
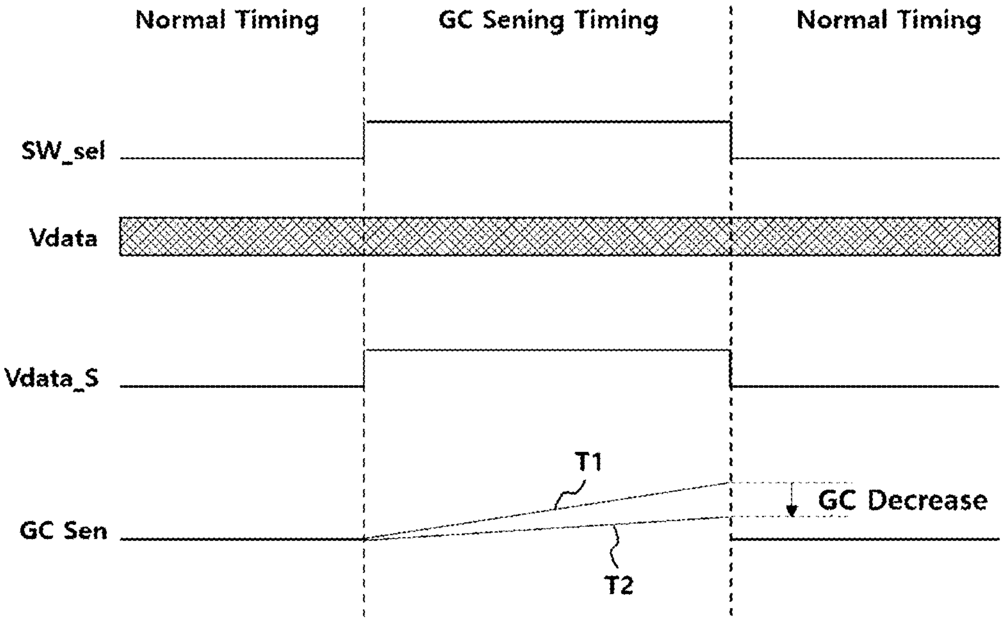

FIGS. 10 and 11 are diagrams illustrating a fluctuation of a global current according to an accumulation of use of a display device.

Referring to FIG. 10, the global current value may generally be best at a time point T1, which is an initial usage time point of the display device. The global current may then decrease as the usage time of the display device is accumulated.

Therefore, the global current value at a time point T2 after the accumulated usage time of the display device has elapsed for a certain time or more may be smaller than the global current value at the time point T1.

Since the global sensing current generating circuit of the display device repeats the current sensing period with a time difference, as shown in FIG. 11, it may output the global current sensing value GC Sen at the time point T1 and may also output the global current sensing value GC Sen at the time point T2. Here, the global current sensing value at the time point T2 may be smaller than the global current sensing value at the time point T1.

In other words, the global current sensing value may gradually decrease as the usage time of the display device is accumulated.

The timing controller 130 of the display device may receive the global current sensing value according to the accumulated usage time from the global sensing current generating circuit, check the global current fluctuation amount of the display area AA as follows, and compensate for the global current fluctuation amount.

Figure 12:
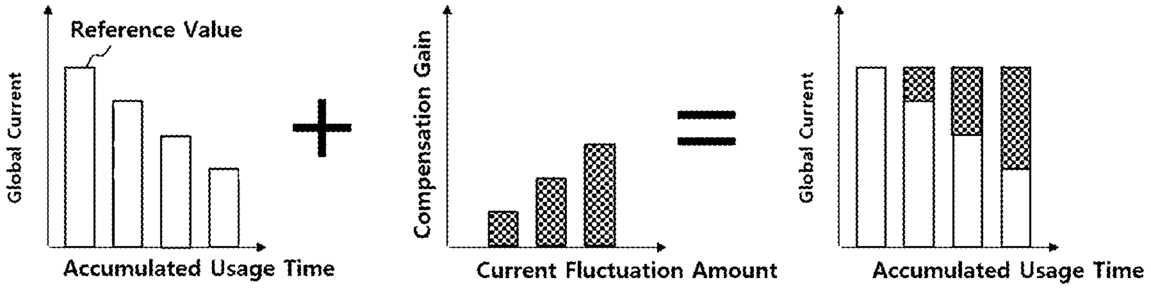
FIG. 12 is a diagram illustrating a method of compensating for a fluctuation in a global current in a display device according to one aspect of the present disclosure.

FIG. 12 is a diagram illustrating a method of compensating for a fluctuation in a global current in a display device according to one aspect of the present disclosure.

The timing controller 130 may store the best global current value of the display device as a reference value.

The timing controller 130 may then compare the global current sensing value received from the global sensing current generating circuit with the reference value to check the global current fluctuation amount in the display area AA.

Subsequently, the timing controller 130 may compensate for the global current fluctuation amount in the display area AA by using a compensation gain corresponding to the global current fluctuation amount. As a result, the global current in the display area AA may be maintained at the reference value regardless of the accumulated usage time of the display device.

Here, the timing controller 130 may store a lookup table as shown in FIG. 13, and may use the lookup table to compensate for the global current fluctuation amount.

Specifically, the timing controller 130 may use the reference value and the global current sensing value to calculate a global current reduction ratio, which is the global current fluctuation amount.

The timing controller 130 may then use a compensation gain corresponding to the calculated global current reduction ratio to increase the luminance value of the image data as a whole.

Thereafter, the timing controller 130 may transmit the image data having an overall increase in the luminance value, i.e., compensated image data, to the data driving circuit 110.

The data driving circuit 110 may increase the data voltage in accordance with the compensated image data, and accordingly, the global current in the display area AA may be maintained at the reference value.

For example, when the global current reduction ratio is 40%, the timing controller 130 may increase the luminance value of the image data as a whole by using a compensation gain of 1.67, which corresponds to the global current reduction ratio of 40% in the lookup table shown in FIG. 13.

This may cause the global current in the display area AA to be maintained at 100%.

Hereinafter, a driving method of the sensing current generating circuit CG will be described.

Figure 14:
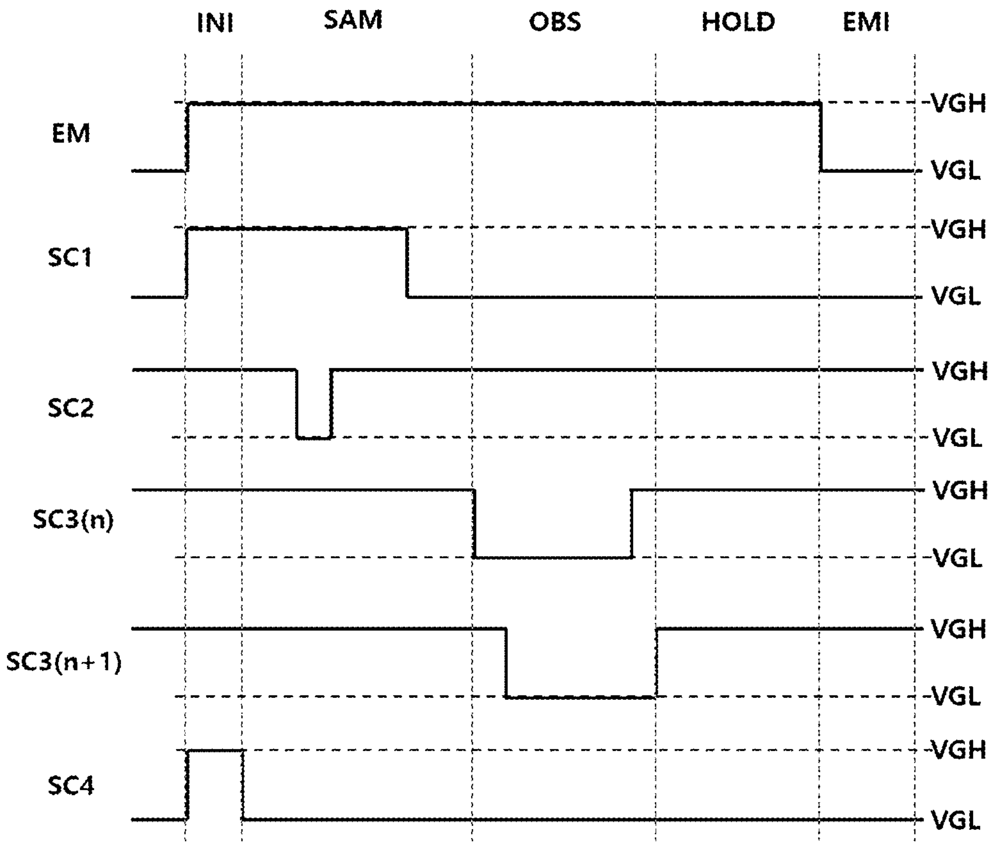
FIG. 14 is a diagram illustrating waveforms of a scan signal and an EM signal generated to drive a sensing current generating circuit.

FIG. 14 is a diagram illustrating waveforms of a scan signal and an EM signal generated to drive a sensing current generating circuit. FIGS. 15 to 19 are circuit diagrams illustrating step-by-step operations of a sensing current generating circuit during a driving period of the sensing current generating circuit.

Referring to FIG. 14, the driving period of the sensing current generating circuit CG may be divided into an initialization period INI, a sampling period SAM, an on-bias period OBS, a holding period HOLD, and an emission period EMI.

Figure 15:
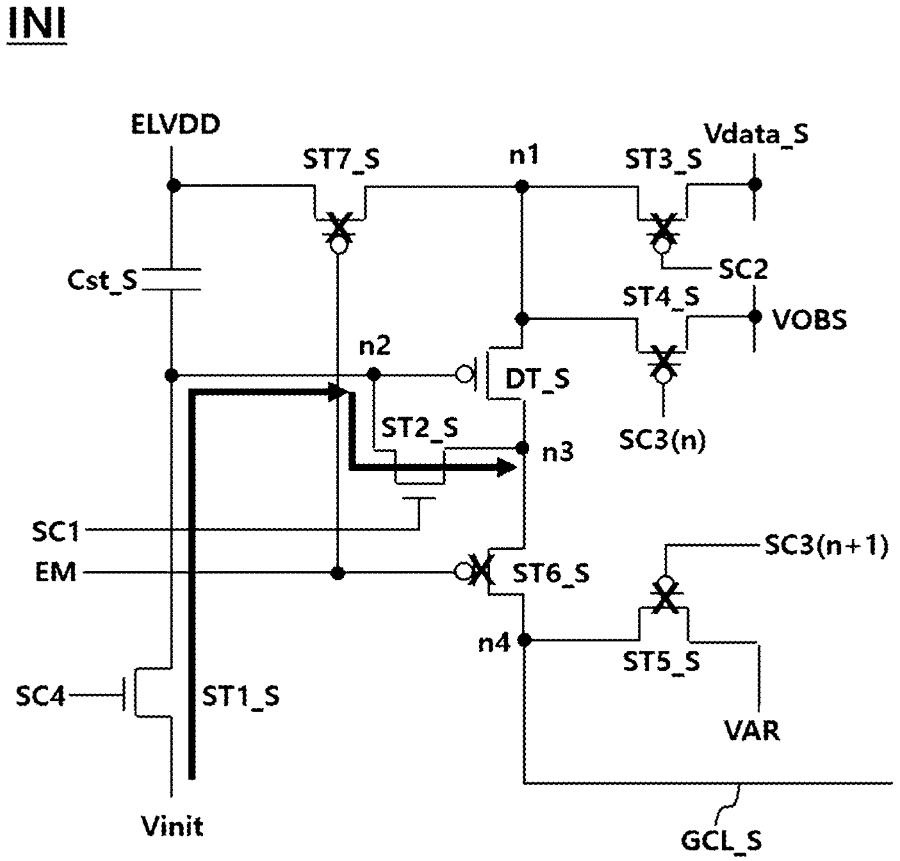
FIGS. 15 to 19 are circuit diagrams illustrating step-by-step operations of a sensing current generating circuit during a driving period of the sensing current generating circuit.

During the initialization period INI, the voltages of scan signals SC1, SC2, SC3(*n*), SC3(*n*+1), and SC4 and an EM signal EM are the gate high voltage VGH. Therefore, during the initialization period INI, as shown in FIG. 15, a first sensing switch transistor ST1_S and a second sensing switch transistor ST2_S are turned on to apply an initialization voltage Vinit to a second node n2 and a third node n3. In addition, the initialization voltage Vinit may also be applied to a first node n1 through the sensing driving transistor DT_S maintained in an on state.

During the initialization period INI, the voltages at the second node n2, the third node n3, and the first node n1 are the initialization voltage Vinit. During the initialization period INI, a fifth sensing switch transistor ST5_S and a sixth sensing switch transistor ST6_S are in an off state, so that a fourth node n4 floats to maintain its previous state. Here, the first sensing switch transistor ST1_S and the second sensing switch transistor ST2_S may be N-channel transistors that are turned on at the gate high voltage VGH. The initialization voltage Vinit may be set to −5V, but is not limited thereto.

During the sampling period SAM, the voltage of a second scan signal SC2 is inverted from the gate high voltage VGH to the gate low voltage VGL.

Figure 16:
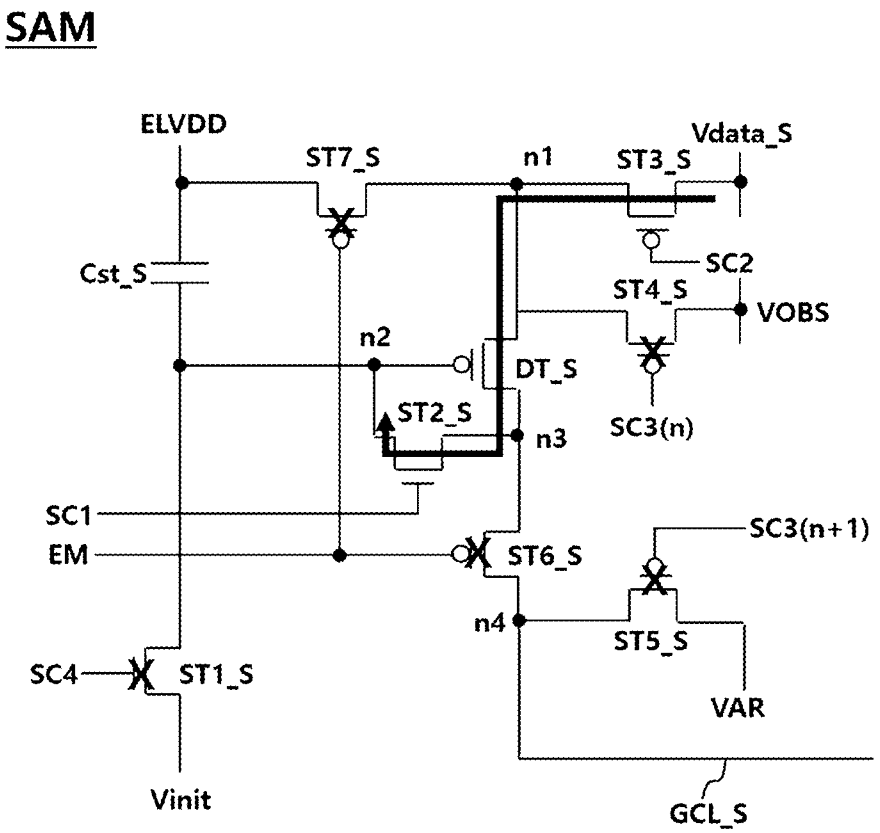

During the sampling period SAM, the voltages of a first scan signal SC1 and the EM signal EM are the gate high voltage VGH, and the voltage of a fourth scan signal SC4 is the gate low voltage VGL. When a third sensing switch transistor ST3_S is turned on during the sampling period SAM in response to the gate low voltage VGL of the second scan signal SC2, as shown in FIG. 16, the current sensing data voltage Vdata_S is applied to the first node n1, and is also applied to the third node n3 and the second node n2 through the sensing driving transistor DT_S in an on state. In this case, the voltage at the first node n1 is the current sensing data voltage Vdata_S, and the voltage at each of the third node n3 and the second node n2 is Vdata_S+Vth+α obtained by adding a threshold voltage Vth of the driving element DT and a threshold voltage change value a of the oxide thin film transistor to the current sensing data voltage Vdata_S. Here, the threshold voltage change value a of the oxide thin film transistor may be a reduction amount of the threshold voltage of the oxide thin film transistor due to stress accumulated in the oxide thin film transistor. The threshold voltage change value a may be a negative number.

Meanwhile, during the sampling period SAM, the fourth node n4 is in a floating state. Here, the third sensing switch transistor ST3_S may be a P-channel transistor that is turned on at the gate low voltage VGL. The current sensing data voltage Vdata_S may be set to a voltage between 0V and 4V, but is not limited thereto.

During the on-bias period OBS, the voltages of a third (n)th scan signal SC3(*n*) and a third (n+1)th scan signal SC3(*n*+1) are inverted from the gate high voltage VGH to the gate low voltage VGL.

A fourth sensing switch transistor ST4_S is turned on during the on-bias period OBS in response to the gate low voltage VGL of the third (n)th scan signal SC3(*n*).

Figure 17:
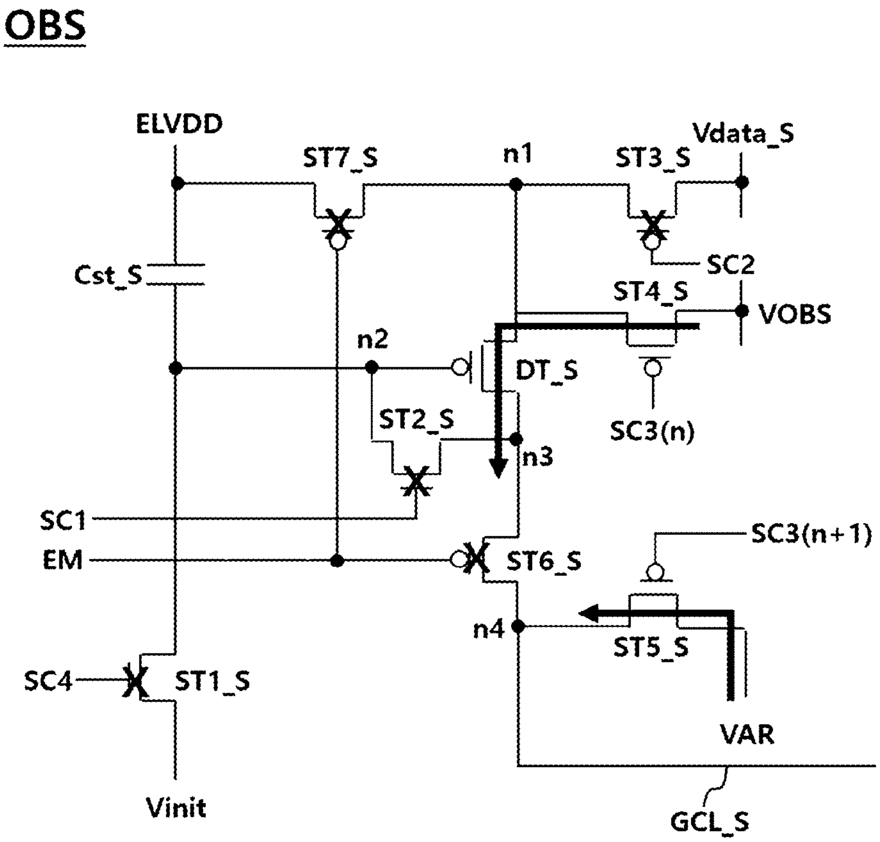

Then, the fifth sensing switch transistor ST5_S is turned on during the on-bias period OBS in response to the gate low voltage VGL of the third (n+1)th scan signal SC3(*n*+1). As a result, as shown in FIG. 17, a first compensation voltage VOBS is applied to the first node n1 and the third node n3, and a second compensation voltage VAR is applied to the fourth node n4.

In this case, the voltages at the first node n1 and the third node n3 are the first compensation voltage VOBS, and the voltage at the fourth node n4 is the second compensation voltage VAR. The voltage at the second node n2 may be a voltage of Vdata_S+Vth+α by maintaining its previous state. Here, the fourth sensing switch transistor ST4_S and the fifth sensing switch transistor ST5_S may be P-channel transistors that are turned on at the gate low voltage VGL. The first compensation voltage VOBS and the second compensation voltage VAR may each be set to −4.5V, but are not limited thereto.

Figure 18:
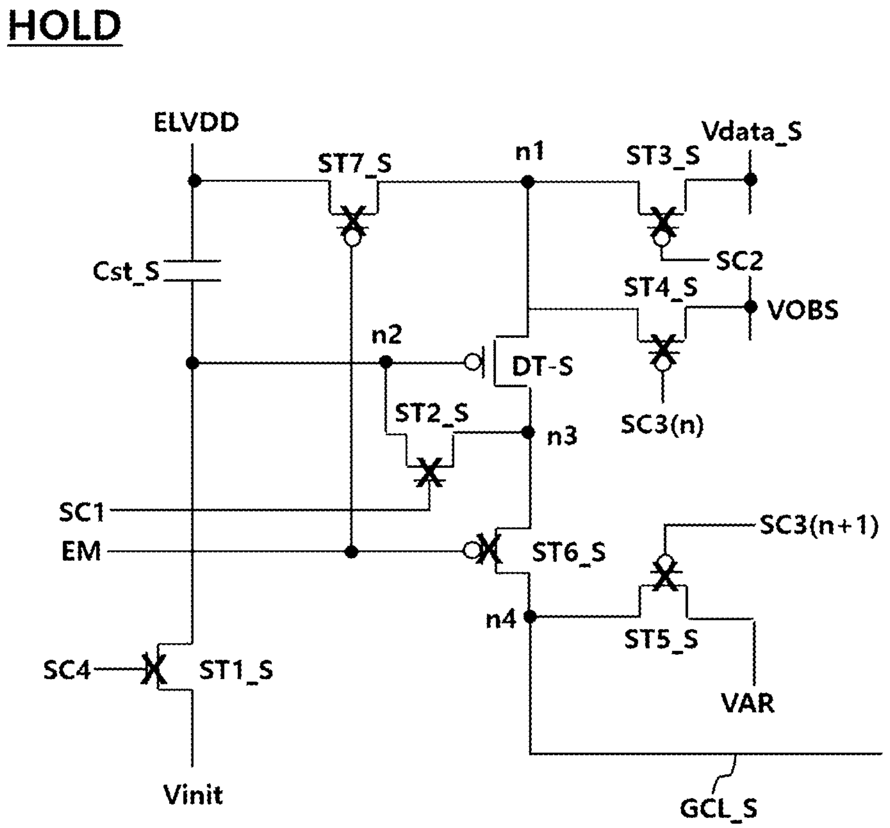

During the holding period HOLD, the voltages of the first scan signal SC1 and the fourth scan signal SC4 are the gate low voltage VGL, and the voltages of the second scan signal SC2, the third (n)th scan signal SC3(*n*), and the third (n+1)th scan signal SC3(*n*+1) are the gate high voltage VGH. The voltage of the EM signal EM is the gate high voltage VGH during the holding period HOLD. Therefore, as shown in FIG. 18, the first sensing switch transistor ST1_S to a seventh sensing switch transistor ST7_S are all in the off state, and thus the first node n1 to the fourth node n4 float to maintain their previous states.

Figure 19:
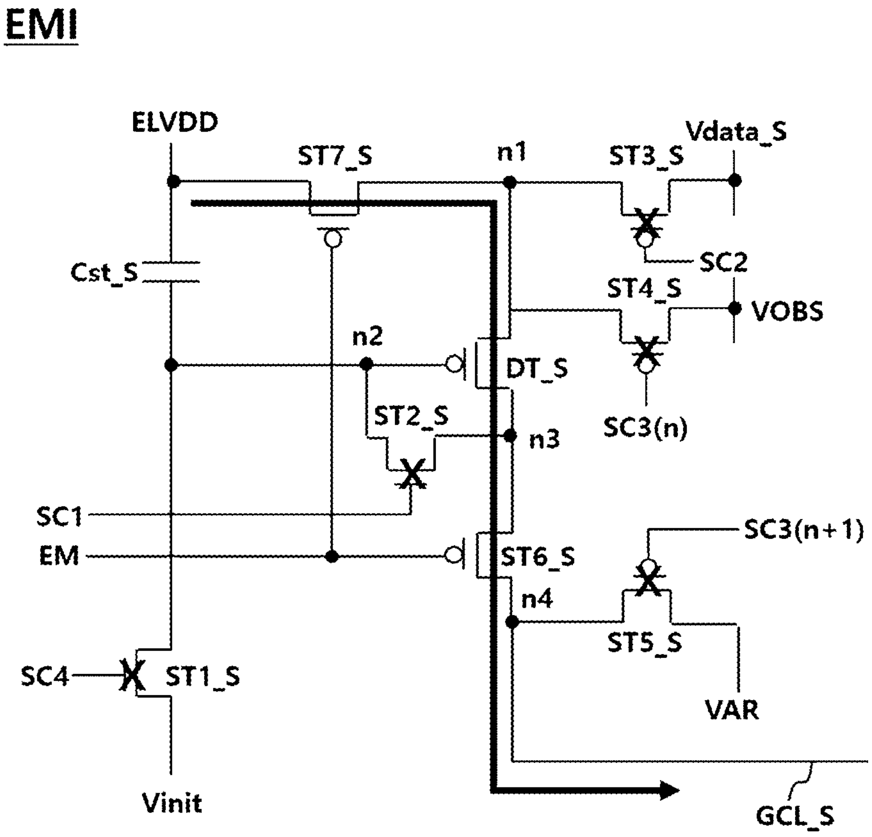

During the emission period EMI, the voltages of the first scan signal SC1, the fourth scan signal SC4, and the EM signal EM are the gate low voltage VGL, and the voltages of the second scan signal SC2, the third (n)th scan signal SC3(*n*), and the third (n+1)th scan signal SC3(*n*+1) are the gate high voltage VGH. As shown in FIG. 19, the sixth sensing switch transistor ST6_S and the seventh sensing switch transistor ST7_S are turned on in response to the gate low voltage VGL of the EM signal EM. Therefore, a current path is formed between the high voltage power ELVDD and the fourth node n4 during the emission period EMI.

During the emission period EMI, a sensing current generated based on a gate-source voltage Vdata_S+Vth+α of the sensing driving transistor DT_S may be outputted to the single current sensing line GCL_S. Here, the sixth sensing switch transistor ST6_S and the seventh sensing switch transistor ST7_S may be P-channel transistors that are turned on at the gate low voltage VGL. The high voltage power ELVDD may be set to 6V, but is not limited thereto.

Through the operation of the sensing current generating circuit CG as described above, a sensing current reflecting the stress accumulated in the plurality of sensing switch transistors that are oxide thin film transistors may be generated in the sensing current generating circuit CG.

As described above, in one aspect of the present disclosure, the plurality of sensing current generating circuits CG may be disposed to be subjected to the same level of stress as the plurality of pixel circuits P, and the sensing currents outputted from the plurality of sensing current generating circuits CG may be summed to derive the global current value of the display area AA.

In one aspect of the present disclosure, the sensing current generating circuit has been described as performing only the function of generating a sensing current. However, the present disclosure is not limited thereto, and the sensing current generating circuit may further perform other functions. In other words, the sensing current generating circuit may also be used for other purposes.

Figure 20:
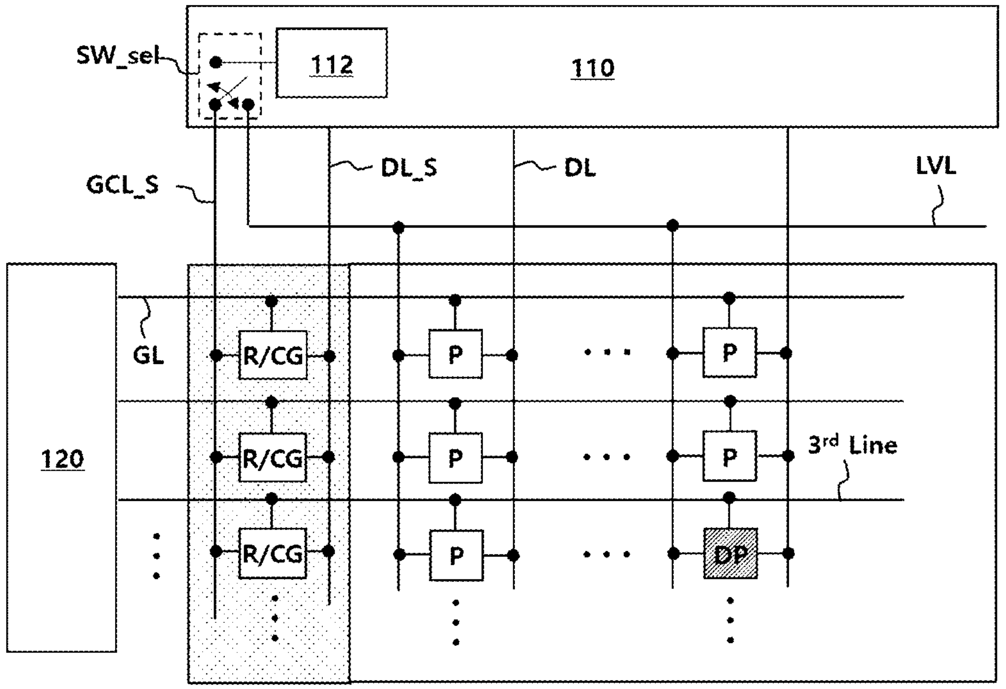
FIG. 20 is a block diagram illustrating a global sensing current generating circuit according to another aspect of the present disclosure.
Figure 21:
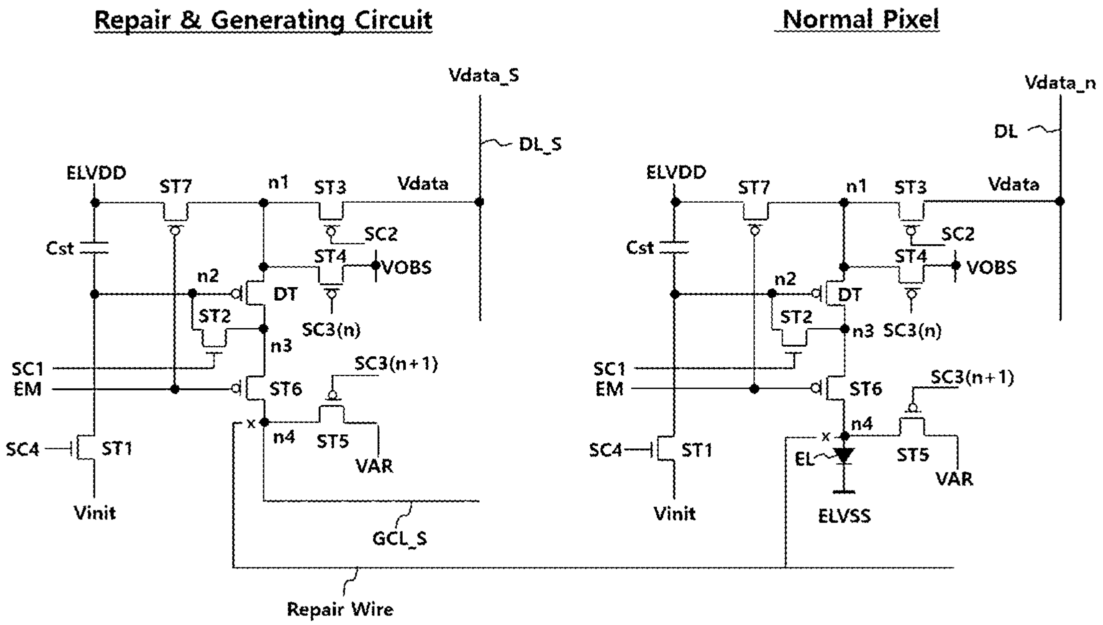
FIGS. 21 and 22 are diagrams exemplarily illustrating a sensing current generating circuit according to another aspect of the present disclosure.
Figure 22:
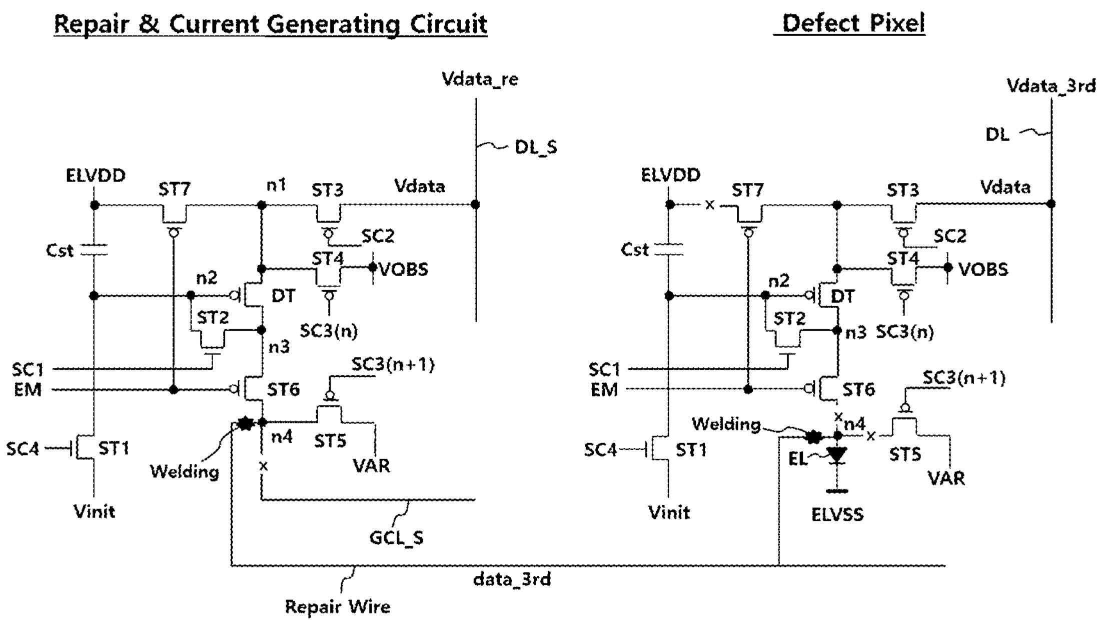

FIG. 20 is a block diagram illustrating a global sensing current generating circuit according to another aspect of the present disclosure. FIGS. 21 and 22 are diagrams exemplarily illustrating a sensing current generating circuit according to another aspect of the present disclosure.

Referring to FIG. 20, in another aspect of the present disclosure, the global sensing current generating circuit may include a plurality of repair/current generating circuits R/CG that are also used as repair pixel circuits for repairing a defective pixel circuit DP included in the plurality of pixel circuits P. Although FIG. 20 illustrates that the plurality of repair/current generating circuits R/CG are disposed in the form of one pixel column on one side of the display area AA, the present disclosure is not limited thereto, and the plurality of repair/current generating circuits R/CG may be disposed in the form of two or more pixel columns. Alternatively, the plurality of repair/current generating circuits R/CG may be disposed on both sides of the display area AA.

The repair/current generating circuit R/CG, which is the sensing current generating circuit according to another aspect of the present disclosure, is composed of the same transistors as the pixel circuit, as shown in FIGS. 21 and 22. In other words, the repair/current generating circuit R/CG may include one or more oxide thin film transistors (e.g., ST1 and ST2).

In addition, the light emitting element EL is not connected to the fourth node n4, and the single current sensing line GCL_S is connected to the fourth node n4.

The current sensing data line DL_S may be supplied with the current sensing data voltage Vdata_S as shown in FIG. 21, or may be supplied with a repair data voltage Vdata_re as shown in FIG. 22.

A repair wire may be disposed between one or more pixel circuits P forming one pixel line and the repair/current generating circuit R/CG.

As shown in FIG. 21, a normal pixel circuit (Normal Pixel) and the repair/current generating circuit R/CG are not electrically connected by the repair wire (Repair Wire).

In addition, during the current sensing period of the global sensing current generating circuit, the current sensing data voltage Vdata_S may be supplied to the repair/current generating circuit R/CG.

On the other hand, as shown in FIG. 22, a defective pixel circuit (Defect Pixel) and the repair/current generating circuit R/CG are electrically connected by the repair wire (Repair Wire). Here, the fourth node n4 of the repair/current generating circuit R/CG and the repair wire (Repair Wire) are electrically connected by welding or the like, and the fourth node n4 of the defective pixel circuit (Defect Pixel) and the repair wire (Repair Wire) are electrically connected by welding or the like.

The repair/current generating circuit R/CG and the single current sensing line GCL_S are disconnected. In addition, in the defective pixel circuit (Defect Pixel), the power line through which the high voltage power ELVDD is supplied, a line connecting the fourth node n4 to a fifth switch transistor ST5, and a line connecting the fourth node n4 to a sixth switch transistor ST6 are also disconnected.

When the repair/current generating circuit R/CG is electrically connected to the defective pixel circuit (Defect Pixel) as shown in FIG. 22, the repair data voltage Vdata_re is supplied to the current sensing data line DL_S. Here, the repair data voltage Vdata_re is a data voltage supplied to the defective pixel circuit (Defect Pixel).

For example, when the defective pixel circuit DP is located on a third line (3rd Line) as shown in FIG. 20, a data voltage Vdata_3rd of the third line may be supplied as the repair data voltage Vdata_re.

This allows a driving current corresponding to image data (data_3rd) of the third line to flow through the repair wire (Repair Wire) to the light emitting element EL of the defective pixel circuit (Defect Pixel).

As described above, the current sensing data voltage Vdata_S is not supplied to the repair/current generating circuit R/CG electrically connected to the defective pixel circuit (Defect Pixel).

Figure 23:
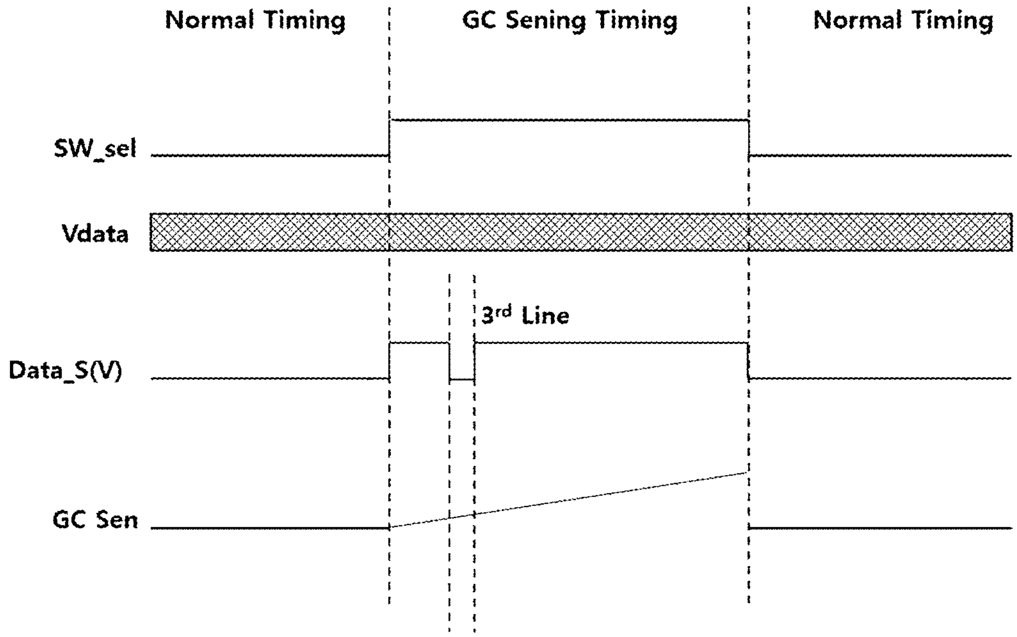
FIG. 23 is a diagram illustrating a driving method of a global sensing current generating circuit according to another aspect of the present disclosure.

For example, when the repair/current generating circuit R/CG of the third line is connected to the defective pixel circuit DP of the third line (3rd Line) as shown in FIG. 20, the current sensing data voltage Vdata_S is not supplied to the repair/current generating circuit R/CG of the third line (3rd Line) in the current sensing period (GC Sensing Timing) as shown in FIG. 23. Therefore, the light emitting element EL of the defective pixel circuit (Defect Pixel) electrically connected to the repair/current generating circuit R/CG of the third line (3rd Line) does not emit light by the current sensing data voltage Vdata_S.

Here, the global current sensing value GC Sen is the sum of the sensing currents outputted from the plurality of repair/current generating circuits R/CG. Therefore, even if a few of the plurality of repair/current generating circuits R/CG are used as repair pixel circuits, the reliability of the global current sensing value GC Sen is not significantly degraded.

Figure 24:
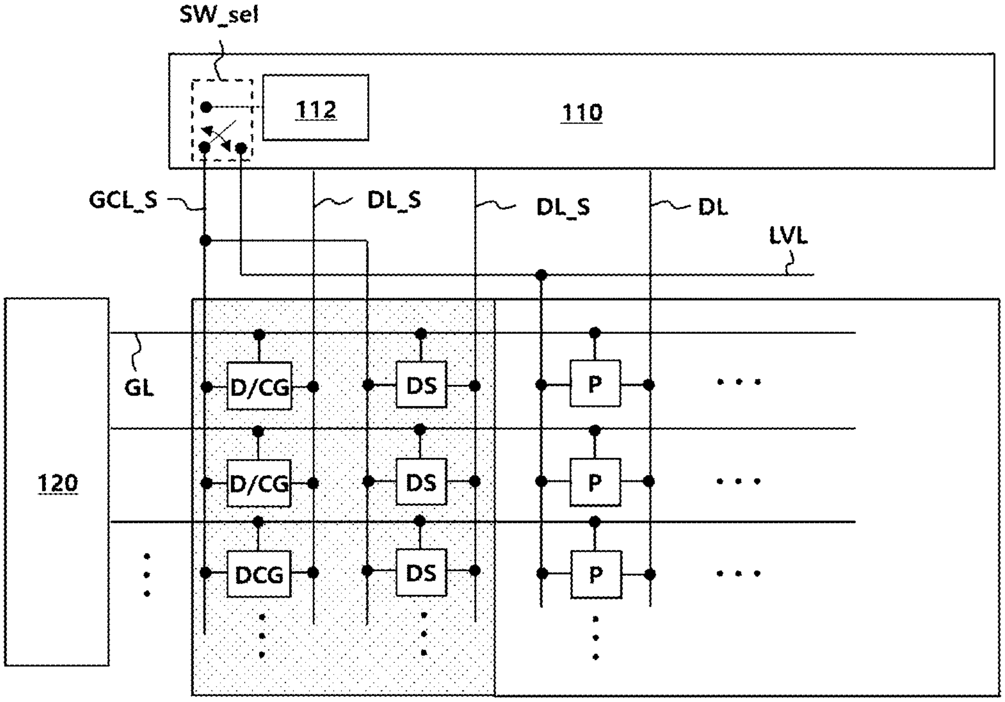
FIG. 24 is a block diagram illustrating a global sensing current generating circuit according to still another aspect of the present disclosure.
Figure 25:
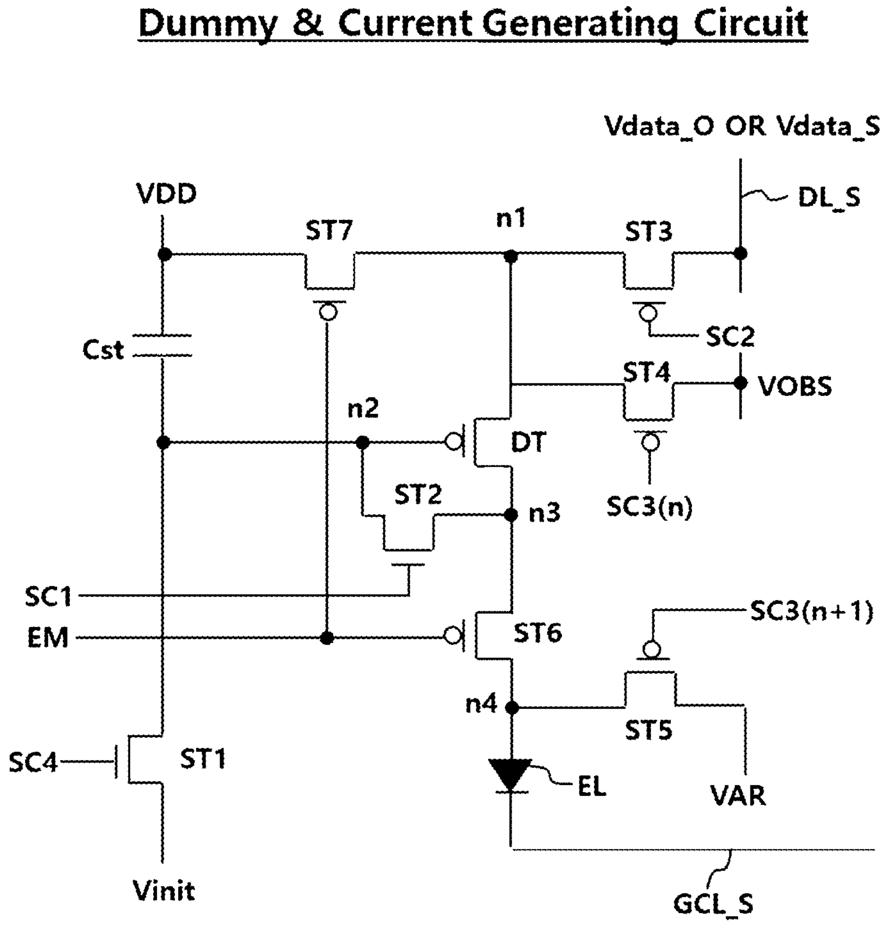
FIG. 25 is a diagram exemplarily illustrating a sensing current generating circuit according to still another aspect of the present disclosure.

FIG. 24 is a block diagram illustrating a global sensing current generating circuit according to still another aspect of the present disclosure. FIG. 25 is a diagram exemplarily illustrating a sensing current generating circuit according to still another aspect of the present disclosure.

Referring to FIG. 24, in still another aspect of the present disclosure, the global sensing current generating circuit may include a dummy/current generating circuit D/CG that is also used as a dummy pixel circuit that is driven during orbit driving of the display device. Here, the orbit driving refers to a driving method that mitigates degradation and afterimage of the plurality of pixel circuits P by moving the entire display image according to a predetermined period.

Although FIG. 24 illustrates that the plurality of dummy/current generating circuits D/CG are disposed in the form of two pixel columns on one side of the display area AA, the present disclosure is not limited thereto, and the plurality of dummy/current generating circuits D/CG may be disposed in the form of one or three or more pixel columns. Alternatively, the plurality of dummy/current generating circuits D/CG may be disposed on both sides of the display area AA.

The dummy/current generating circuit D/CG, which is the sensing current generating circuit according to still another aspect of the present disclosure, is composed of the same transistors as the pixel circuit, as shown in FIG. 25. In other words, the dummy/current generating circuit D/CG may include one or more oxide thin film transistors (e.g., ST1 and ST2).

In addition, the light emitting element EL is connected to the fourth node n4, and the single current sensing line GCL_S is connected to the cathode of the light emitting element EL.

The current sensing data voltage Vdata_S or an orbit driving data voltage Vdata_O may be supplied to the current sensing data line DL_S. Here, the current sensing data voltage Vdata_S is supplied during the current sensing period, and the orbit driving data voltage Vdata_O is supplied during the orbit driving.

In still another aspect of the present disclosure, since the dummy/current generating circuit D/CG includes the light emitting element EL, when the current sensing data voltage Vdata_S is supplied to the dummy/current generating circuit D/CG during the current sensing period, the light emitting element EL of the dummy/current generating circuit D/CG may emit light.

Accordingly, in still another aspect of the present disclosure, the current sensing period may be a turn-on time point of the display device, a turn-off time point thereof, an operation time point of a screen saver, and the like. In addition, in the current sensing period, an image suitable for the light emitting pattern of the plurality of dummy/current generating circuits D/CG may be displayed in the display area AA.

Although the aspects of the present disclosure have been described in more detail with reference to the accompanying drawings, the present disclosure is not limited thereto and may be embodied in many different forms without departing from the technical concept of the present disclosure. Therefore, the aspects disclosed in the present disclosure are provided for illustrative purposes only and are not intended to limit the technical concept of the present disclosure. The scope of the technical concept of the present disclosure is not limited thereto. Therefore, it should be understood that the above-described aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An integrated circuit comprising:

a plurality of sensing current generating circuits; and a single current sensing line connected to the plurality of sensing current generating circuits, and through which sensing currents generated by the plurality of sensing current generating circuits flow during a current sensing period, wherein each of the sensing current generating circuits includes:

a driving transistor configured to generate the sensing current based on a gate-source voltage;

a capacitor configured to charge the gate-source voltage of the driving transistor; and a plurality of switch transistors electrically connected to the driving transistor and the capacitor and configured to sample a threshold voltage of the driving transistor.

2. The integrated circuit of claim 1, further comprising a current summing circuit configured to receive the sensing currents generated by the plurality of sensing current generating circuits through the single current sensing line and to output a global current sensing value obtained by summing current values of the sensing currents during the current sensing period.

3. The integrated circuit of claim 2, further comprising a switch circuit configured to electrically connect the single current sensing line to the current summing circuit during the current sensing period, and to electrically connect the single current sensing line to a low voltage power line commonly connected to a plurality of pixel circuits during a period other than the current sensing period.

4. The integrated circuit of claim 3, further comprising a current sensing data line connected to the plurality of sensing current generating circuits and configured to supply a current sensing data voltage to the plurality of sensing current generating circuits during the current sensing period.

5. The integrated circuit of claim 3, wherein the driving transistor is a same type of transistor as a driving transistor included in a pixel circuit, and the plurality of switch transistors are the same type of transistors as a plurality of switch transistors included in the pixel circuit.

6. The integrated circuit of claim 5, wherein the plurality of switch transistors of the sensing current generating circuit and the plurality of switch transistors of the pixel circuit are oxide transistors.

7. The integrated circuit of claim 6, wherein the plurality of switch transistors of the sensing current generating circuit and the plurality of switch transistors of the pixel circuit are of a same number.

8. The integrated circuit of claim 6, wherein when the pixel circuit is driven while the low voltage power line and the single current sensing line are electrically connected by the switch circuit, at least one of positive bias stress and negative bias stress is accumulated in the plurality of switch transistors and the plurality of switch transistors included in the pixel circuit.

9. The integrated circuit of claim 2, wherein the current summing circuit includes an analog-to-digital converter (ADC) circuit configured to sum the current values of the sensing currents, which are analog values, and to output a summed value as the global current sensing value, which is a digital value, during the current sensing period.

10. The integrated circuit of claim 1, wherein the sensing current generating circuit does not include a light emitting element.

11. The integrated circuit of claim 10, wherein the sensing current generating circuit is also used as a repair pixel circuit for repairing a defective pixel circuit included in a display area.

12. The integrated circuit of claim 11, further comprising a current sensing data line connected to the plurality of sensing current generating circuits and configured to supply a current sensing data voltage to the plurality of sensing current generating circuits during the current sensing period, wherein when an $N^{th}$ sensing current generating circuit of the plurality of sensing current generating circuits is used as the repair pixel circuit, the current sensing data voltage is not supplied to the $N^{th}$ sensing current generating circuit during the current sensing period, N being a natural number of 1 or more.

13. The integrated circuit of claim 1, further comprising a dummy/current generating circuit including a light emitting element EL, wherein the dummy/current generating circuit is also used as a dummy pixel circuit.

14. A display device comprising:

an integrated circuit including a plurality of sensing current generating circuits disposed adjacent to one side of a display area, a single current sensing line connected to the plurality of sensing current generating circuits and through which sensing currents generated by the plurality of sensing current generating circuits flow during a current sensing period, and a current summing circuit configured to receive the sensing currents generated by the plurality of sensing current generating circuits through the single current sensing line and to output a global current sensing value obtained by summing current values of the sensing currents during the current sensing period; and a timing controller configured to receive the global current sensing value outputted from the current summing circuit, check a global current fluctuation amount in the display area using the global current sensing value, and compensate for the global current fluctuation amount.

15. The display device of claim 14, wherein the timing controller compensates for the global current fluctuation amount by increasing a luminance value of image data displayed in the display area as a whole.

16. The display device of claim 15, wherein the timing controller increases the luminance value of the image data as a whole by using a gain value corresponding to the global current sensing value in a pre-stored lookup table.

17. The display device of claim 14, wherein the current summing circuit includes an analog-to-digital converter (ADC) circuit configured to sum the current values of the sensing currents, which are analog values, and to output a summed value as the global current sensing value, which is a digital value, during the current sensing period.

18. The display device of claim 17, wherein the analog-to-digital converter (ADC) circuit is a single slope analog-to-digital converter (ADC) circuit.

19. The display device of claim 14, further comprising a plurality of pixel circuits included in the display area in a driving state during the current sensing period.

20. The display device of claim 14, wherein the sensing current generating circuit includes:

a driving transistor configured to generate the sensing current based on a gate-source voltage;

a capacitor configured to charge the gate-source voltage of the driving transistor; and a plurality of switch transistors electrically connected to the driving transistor and the capacitor and configured to sample a threshold voltage of the driving transistor.

21. The display device of claim 20, wherein the driving transistor is a same type of transistor as a driving transistor included in a pixel circuit, and the plurality of switch transistors are a same type of transistors as a plurality of switch transistors included in the pixel circuit.

22. The display device of claim 21, wherein the plurality of switch transistors of the sensing current generating circuit and the plurality of switch transistors of the pixel circuit are oxide transistors.

23. The display device of claim 22, wherein the plurality of switch transistors of the sensing current generating circuit and the plurality of switch transistors of the pixel circuit are of a same number.

* * * * *